(12) United States Patent
Crane

(10) Patent No.: US 8,487,566 B2
(45) Date of Patent: Jul. 16, 2013

(54) ELECTRONIC COMMUTATOR CIRCUITS

(75) Inventor: Allan David Crane, Gwynedd (GB)

(73) Assignee: Converteam UK Ltd., Warwickshire (GB)

( * ) Notice: Subject to any disclaimer, the term of this patent is extended or adjusted under 35 U.S.C. 154(b) by 76 days.

(21) Appl. No.: 12/965,236

(22) Filed: Dec. 10, 2010

(65) Prior Publication Data

US 2011/0074325 A1 Mar. 31, 2011

Related U.S. Application Data

(63) Continuation of application No. 11/636,898, filed on Dec. 11, 2006, now Pat. No. 7,852,025.

(51) Int. Cl.
*H02P 6/14* (2006.01)

(52) U.S. Cl.
USPC ............ 318/400.26; 318/400.01; 318/400.27; 318/400.28; 318/721

(58) Field of Classification Search
USPC 318/400.01, 400.02, 400.14, 400.26–400.28, 318/400.42, 701, 721, 727, 800, 801, 823, 318/432, 437, 139, 400.29, 685, 696; 327/440
See application file for complete search history.

(56) References Cited

U.S. PATENT DOCUMENTS

| | | | |
|---|---|---|---|
| 3,619,746 A | 11/1971 | Thornton et al. | |
| 3,663,878 A | 5/1972 | Miyasaka | |
| 3,678,352 A * | 7/1972 | Bedford | 318/400.41 |
| 3,749,991 A | 7/1973 | Kuniyoshi | |
| 3,858,107 A | 12/1974 | Yarrow | |
| 4,035,699 A | 7/1977 | Schade | |
| 4,035,712 A | 7/1977 | Yarrow et al. | |
| 4,047,081 A | 9/1977 | Liska | |

(Continued)

FOREIGN PATENT DOCUMENTS

| | | |
|---|---|---|
| DE | 30 03 691.4 A1 | 8/1983 |
| EP | 0621678 A1 | 1/1994 |

(Continued)

OTHER PUBLICATIONS

Teconi, S. M., et al, The Reverse Blocking GTO As a Very Fast Turn-Off Thyristor, IEEE Transactions on Industry Applications, IEEE Service Center, Sep. 1, 1990, pp. 840-846.

(Continued)

*Primary Examiner* — Antony M Paul
(74) *Attorney, Agent, or Firm* — Eckert Seamans Cherin & Mellott, LLC; Philip E. Levy

(57) ABSTRACT

The present invention provides an electronic commutator circuit for use with a stator winding of an electrical machine. The stator winding of the electrical machine includes a number of coils linked by the same number of points of common coupling. The electronic commutator circuit comprising the same number of switching stages, each switching stage being connected between a respective one of the points of common coupling and first and second dc terminals. Each switching stage further includes a first reverse blocking semiconductor power device (such as a Reverse Blocking Gate Turn Off Thyristor (RB-GTO 1) capable of being turned on and off by gate control having its anode connected to the first dc terminal, and a second reverse blocking semiconductor power device (RB-GTO 2) capable of being turned on and off by gate control having its cathode connected to the second dc terminal.

60 Claims, 19 Drawing Sheets

U.S. PATENT DOCUMENTS

| | | | |
|---|---|---|---|
| 4,117,364 A | | 9/1978 | Baker |
| 4,161,680 A | | 7/1979 | Akamatsu |
| 4,488,101 A | | 12/1984 | Studtmann |
| 4,494,049 A | | 1/1985 | Leitgeb |
| 4,517,636 A | * | 5/1985 | Uchino et al. ............... 363/138 |
| 4,520,300 A | * | 5/1985 | Fradella ...................... 318/603 |
| 4,567,555 A | * | 1/1986 | Matsuse et al. .............. 363/138 |
| 4,692,674 A | | 9/1987 | Packard et al. |
| 5,144,179 A | | 9/1992 | Hilal et al. |
| 5,334,898 A | * | 8/1994 | Skybyk ........................ 310/268 |
| 5,363,039 A | | 11/1994 | Kumar et al. |
| 5,469,033 A | | 11/1995 | Huang |
| 5,635,811 A | | 6/1997 | Rebhan et al. |
| 5,712,802 A | | 1/1998 | Kumar et al. |
| 5,796,599 A | | 8/1998 | Raonic et al. |
| 6,023,137 A | | 2/2000 | Kumar et al. |
| 6,069,809 A | * | 5/2000 | Inoshita ........................ 363/98 |
| 6,144,190 A | | 11/2000 | Scott et al. |
| 6,232,731 B1 | | 5/2001 | Chapman |
| 6,643,157 B2 | | 11/2003 | Furukawa et al. |
| 6,690,127 B2 | * | 2/2004 | Birkestrand et al. .......... 318/139 |
| 7,034,499 B2 | * | 4/2006 | Kerlin et al. ................. 318/749 |

FOREIGN PATENT DOCUMENTS

| | | |
|---|---|---|
| EP | 1333573 A2 | 8/2003 |
| EP | 1519479 A2 | 3/2005 |
| EP | 1345316 A1 | 9/2009 |
| FR | 2563062 | 4/1985 |
| GB | 1360604 | 7/1974 |
| GB | 2117580 A | 10/1983 |
| JP | 6113559 A | 4/1994 |
| JP | 2000224883 A | 8/2000 |
| JP | 2002315381 A | 10/2002 |
| JP | 2004023991 A | 1/2004 |
| JP | 2004166415 A | 6/2004 |
| RU | 1365273 A1 | 1/1988 |

OTHER PUBLICATIONS

Joachim, Holtz, et al., Gate-Assisted Reverse and Forward Recovery of High-Power GTO's in Series Resonant DC-Link Inverters, IEEE Transactions on Power Electronics, IEEE Service Center, Mar. 1999, pp. 227-230.

Yamaguchi, Y., et al., A 6V/5kA Reverse Conducting GCT, Conference Record of the 2001 IEEE Industry Applications Conference, 36th IAS Annual Meeting, Chicago, IL, Sep. 30-Oct. 4, 2001, Conference Record of the IEEE Industry Applications Conference, IAS Annual Meeting, NY, Sep. 2001, pp. 1497-1503.

Cyril W. Lander: Power Electronics, 1993, McGraw Hill, Berkshire England, p. 5.

De Concker R.W., Medium-Voltage Power Electronic Technologies for Future Decentralized Power Systems; Power Conversion Conference, 2002, PCC-Osaka 2002, Proceedings of the Osaka, Japan, Apr. 2-5, 2002, pp. 927-932.

Motto, K., et al., High Frequency Operation of a Megawatt Voltage Source Inverter Equipped With ETOs, APEC 2001, 16th Annual IEEE Applied Power Electronics Conference and Exposition, Mar. 4-8, 2001, Annual Aplied Power Electronics Conference, New York, pp. 924-930.

* cited by examiner

TECHNICAL DETAIL

TECHNICAL DETAIL

ELECTRONIC COMMUTATOR CIRCUITS

CROSS-REFERENCE TO RELATED APPLICATION

The present application is a continuation of co-pending U.S. application Ser. No. 11/636,898, filed Dec. 11, 2006.

FIELD OF THE INVENTION

The present invention relates to electronic commutator circuits, and in particular to circuits for rotating and linear machines (such as brushless dc rotating and linear machines, for example) that employ forced electronic commutation.

BACKGROUND OF THE INVENTION

A dc rotating machine typically includes a rotor surrounded by a wound stator. A rotor connected commutator with copper segments and stationary brushgear are used to control the commutation of current in the rotor winding based on the angular position of the rotor. In a further development of the dc rotating machine, an electronic switching circuit is used to control the commutation of current in the stator winding based on the angular position of the rotor. The rotor provides a rotating magnetic field and this can be generated by permanent magnets, conventional windings with a slip ring or brushless excitation power supply, or superconducting windings with a suitable excitation power supply.

British Patent Application 2117580 discloses a brushless dc rotating machine that employs an electronic switching circuit. The electronic switching circuit essentially replicates a conventional brush and commutator topology for an industry-standard lap wound stator where the brushes are replaced by thyristors and the commutator segments are replaced by a point of common coupling between associated pairs of thyristors. One thyristor in each thyristor pair has its anode connected to a first dc terminal, while the other thyristor in that pair has its cathode connected to a second dc terminal. A stator winding with n series connected coils has n nodes that intercept the n points of common coupling in the electronic switching circuit. This is illustrated in FIG. 1 for the case where n=8.

It can seen from FIG. 1 that a first coil C1 is connected to a second coil C2 and to a first pair of thyristor switches S1a and S1b by means of a first point of common coupling PCC1. The anode of thyristor S1a is connected to a first dc terminal DC1 by means of a first ring "Ring 1" and the cathode of thyristor S1b is connected to a second dc terminal DC2 by means of a second ring "Ring 2". The second coil C2 is connected to a third winding C3 and to a second pair of thyristor switches S2a and S2b by a second point of common coupling PCC2. The anode of thyristor S2a is connected to the first dc terminal DC1 by means of the first ring "Ring 1" and the cathode of thyristor S2b is connected to the second dc terminal DC2 by means of the second ring "Ring 2". The remaining coils are connected to the first dc terminal DC1 and the second dc terminal DC2 in a corresponding manner.

The thyristor pairs are commutated by the back EMF (i.e. the electromotive force induced in the stator windings) of the brushless dc rotating machine and by the application of gate pulses that are synchronised with the angular position of the rotor. At low rotor speeds this back EMF can be insufficient for the commutation of the thyristors and an external commutation circuit of the dc line type is employed. This external commutation circuit is also synchronised to the angular position of the rotor and hence to the gating of the thyristor pairs.

The brushless dc rotating machine of British Patent Application 2117580 suffers from the following disadvantages:

(i) the synchronisation of the gating of the thyristor pairs to the angular position of the rotor is difficult to implement and is prone to electromagnetic interference; and (ii) the gating synchronisation of the thyristor pairs and the subsequent commutation process is not capable of precisely adapting to the load conditions of the machine.

It will be readily understood that it is possible to derive a general linear machine equivalent of the brushless dc rotating machine described in British Patent Application 2117580. This brushless dc rotating machine is depicted in FIG. 1 as having a pair of ring-type dc terminals and a circular array of switching stages but these can be represented in a linear form for ease of clarity.

The linear form of a basic stator winding (polygonal winding or lap winding) and electronic commutator circuit is shown in FIG. 2. The electronic commutator circuit consists of a number of identical switching stages disposed in a linear rather than a circular array. Each switching stage includes a pair of thyristors 1 and 2 as shown in FIG. 3. During operation of a dc electrical machine in a generating mode, for the majority of the time, dc current flows into the winding at a first point in the array and flows out of the winding at a second point in the array. The second point is displaced approximately 180 electrical degrees from the first point. The winding current diverges into two approximately equal paths at the first point and recombines at the second point, as shown in FIG. 2. In order to effect commutation, the location of the first point or the second point must be indexed one step along the array. The indexing may occur simultaneously, from the first point to a third point and from the second point to a fourth point, or the indexing may be sequential, with initial indexing from the first point to the third point followed by indexing from the second point to the fourth point. According to well-known natural commutation terminology, a switching device that carries current after the commutation is known as an incoming device and the device that carries current before the commutation is known as an outgoing device. The condition of these two devices is subject to overlap and reverse recovery, and phase control may be employed. In this case, the indexing is caused by the application of a gate pulse to the incoming device at a time when its terminals are forward biased (anode positive with respect to the cathode) and in so doing causing the power terminals of the outgoing device to be reverse biased.

A generic commutation process for the incoming and outgoing thyristor of adjacent switching stages is shown in FIGS. 4 and 5. FIG. 4 depicts the equivalent circuit definitions and FIG. 5 shows idealised commutation waveforms. With reference to FIG. 4, a constant current source "I load" represents the current to be commutated out of the outgoing thyristor and into the incoming thyristor. The rate of change of commutated current is determined by the equivalent circuit representation of the stator winding and comprises a time-variable commuting voltage E and a commutating reactance having an inductance L. The outgoing thyristor carries a current "I out" and supports voltage "V out". The incoming thyristor carries current "I in" and supports voltage "V in".

The outgoing thyristor is considered to be latched on but un-gated at the start of the commutation process. When the incoming thyristor is gated on, the voltage "V in" collapses and current "I in" rises at a rate E/L. Since the current source "I Load" is constant, the current "I out" reduces at a rate E/L. The time taken for the current "I out" to reduce to zero is defined as the overlap. At the end of the overlap, the turn-off process is initiated in the outgoing thyristor. The turn-off process begins with the reverse recovery of the outgoing thyristor; initially the outgoing thyristor conducts in reverse, thereby causing the current "I in" to overshoot and the rate of change of current is determined by E/L. Eventually, towards the end of reverse recovery, the outgoing thyristor conductivity reduces causing the voltage "V out" to increase towards the time-variable commuting voltage -E. The effect of increasing the voltage "V out" is to force current out of the outgoing thyristor. At this time, the outgoing thyristor has not attained significant forward blocking capability, but it does have a reverse blocking capability. The voltage "V out" therefore overshoots as a result of the interruption of current in the stator winding. As commutation continues, the outgoing thyristor steady-state and transient forward voltage blocking capability increase.

Eventually, the voltage "V out" reverses and the outgoing thyristor must support this voltage. The total time available for the outgoing thyristor to attain the required forward voltage blocking capability is known as the turn-off time Tq. This is the time between the negative going reversal of the current "I out" and the subsequent positive going reversal in the voltage "V out". If the turn-off time Tq is sufficient then the current "I out" remains at zero while the voltage "V out" tracks the time-variable commuting voltage E. However, if the turn-off time Tq is not sufficient then the current "I out" is re-established, the voltage "V out" collapses and the outgoing thyristor fails to turn off. This failure is sometimes called as "Tq failure" and can result in the destruction of the outgoing thyristor with the catastrophic malfunction in the associated equipment.

Only one thyristor of each switching stage is shown in FIG. 4 because in the interest of clarity the load current "I load" is assumed to be unidirectional (that is from left to right as drawn). Both of the thyristors have the same polarity such that thyristor current flows from right to left as drawn, except during reverse recovery. However, in cases where the load current is subject to periodic reversal then each switching stage will incorporate a pair of thyristors of opposite polarity.

The commutating voltage E in FIG. 4 is time-variable and is typically sinusoidal. The point in time at which the commutation is initiated may be adjusted in phase, with respect to the waveform of the commutating voltage E, according to the well known technique of phase control.

In principle, naturally commutated thyristors are ideal where the brushless dc rotating machine is used for motoring applications. However, performance limitations are significant when operating at low speeds because the optimum points of current entry into the stator winding are sited where there is inadequate coil voltage to cause reliable commutation. At high motoring torque and low speed the resulting commutation overlap duration leaves inadequate time for the thyristors to attain a forward blocking capability. External dc line commutation apparatus can be employed to overcome the limitations of natural commutation, but this can cause undesirable high amplitude torque pulsations and additional power losses to be generated.

SUMMARY OF THE INVENTION

The present invention provides an electronic commutator circuit for use with a stator winding of an electrical machine, the stator winding having a number of coils linked by the same number of points of common coupling, the electronic commutator circuit comprising the same number of switching stages, each switching stage being connected between a respective one of the points of common coupling and first and second dc terminals and including:

a first reverse blocking semiconductor power device capable of being turned on and off by gate control having its anode connected to the first dc terminal; and
  a second reverse blocking semiconductor power device capable of being turned on and off by gate control having its cathode connected to the second dc terminal.

The use of such first and second semiconductor power devices in place of conventional thyristors means that the electronic commutator circuit can force the commutation of current irrespective of the voltage in the stator winding.

Suitable semiconductor power devices include Reverse Blocking Insulated Gate Bipolar Transistors (RB-IGBTs) and co-located pairs of series-connected discrete Insulated Gate Bipolar Transistors (IGBTs) and diodes. However, these structures do not have internal regenerative properties and their relatively high on-state voltage drops are not ideally suited to the low duty cycle conduction conditions that apply to this type of electronic commutator circuits.

A preferred type of semiconductor power device is the Reverse Blocking Gate Turn Off Thyristor (RB-GTO). RB-GTOs and RB-GTO derivatives benefit from reduced on-state losses relative to other gate commutated device families such as IGBTs as a result of their internal regenerative properties. The switch stage currents take the form of low duty cycle pulsed waveforms with a high peak/mean ratio. Furthermore, the required switching frequency is relatively low (at least by current standards) being equal to the fundamental frequency of the stator and typically less than 100 Hz. RB-GTOs and RB-GTO derivatives with compression mounted hermetically sealed packages are well suited for use with the electronic commutator circuits of the present invention because they provide a near ideal compromise between on-state and switching losses, while at the same time being very reliable.

The first and second semiconductor power devices preferably have unity gain turn off properties. This is described in more detail below.

The electronic commutator circuit preferably further comprises a first polarised switching aid network (snubber) connected in parallel with the first semiconductor power device and a second polarised switching aid network (snubber) connected in parallel with the second semiconductor power device.

Each switching stage of the electronic commutator circuit preferably includes a reactor having a winding that is connected between the cathode of the first semiconductor power device and the point of common coupling, and the anode of the second semiconductor power device and the point of common coupling.

The reactor preferably includes a core that saturates at a small fraction of the rated machine winding current of the dc electrical machine. The core saturation will preferably occur at a reactor winding current of less than 10% of the rated machine winding current. The saturated value of the reactor winding inductance is also preferably less than 1% of the inductance of the stator winding measured between two adjacent points of common coupling and is most preferably as small as is practically achievable. The ratio of the un-saturated value of the reactor winding inductance divided by the saturated value of the reactor winding inductance is preferably greater than a factor of 10 and is most preferably as large as is practically achievable. The objective of the saturable reactor is to reduce the rate of change of the current in the associated first and second semiconductor power devices and hence reduce switching power losses. The reduction in the rate of change of the current is only needed at times of low current flow and at current reversals. The reactor is therefore preferably non-obtrusive at all other times during the operation of the electronic commutator circuit. Hence the desire to employ the largest practical ratio of un-saturated to saturated inductance and the lowest possible saturation current.

The present invention further provides an electrical machine comprising a moving part, a stator, a stator winding having a number of coils linked by the same number of points of common coupling, and an electronic commutator circuit according to any preceding claim, wherein each switching stage of the electronic commutator circuit is connected between a respective one of the points of common coupling and first and second dc terminals.

The electrical machine can be a rotating or linear electrical machine of any suitable type. The rotating or linear electrical machine can be excited by any suitable means and the type of excitation has no effect on the fundamental principles of operation and benefits of the electronic commutator circuit. The electronic commutator circuit can therefore be used with synchronous machines with slip ring or brushless field systems, with conventional or high temperature superconducting or low temperature superconducting field windings, with permanent magnet rotors, in radial, axial and transverse flux orientation and in conventional, inside-out and double-sided configurations. The electrical commutator circuit can also be used with induction machines. A linear electrical machine could be used in applications that inherently benefit from reciprocating motion, for example wave power generators.

The rotating or linear electrical machine may be designed to operate in a motoring mode and/or a generating mode.

In the case of a rotating electrical machine, the moving part is normally referred to as the rotor and in the case of a linear electrical machine the moving part is normally referred to as a translator.

In a rotating electrical machine of the type considered herein, a rotating magnetomagnetic force (MMF) is applied to the stator winding by means of an electronic commutator and a suitable rotary motion control system. The axis of the stator MMF is determined by the axis of a stator current vector, which in turn is determined by the location of the periodically and rotationally indexing stator current entry and exit points. Another MMF is applied to the rotor by any convenient means of excitation that causes this rotor MMF to adopt a fixed or slowly slipping angular relationship with respect to rotor position. In the case of a synchronous machine, the rotor MMF axis adopts a fixed alignment relative to rotor position by virtue of having a fixed mechanical geometry. However, in the case of an induction machine, the rotor MMF is generated by a process of induction between the stator and the rotor and involves a slip process where the nature of the rotor MMF is said to slip with respect to the rotation of the stator MMF. An air gap is present between the stator and the rotor. The stator MMF reacts with the rotor MMF such that a circumferential force is generated within the air gap between the rotor and the stator whenever there is a displacement angle between the axes of the rotor and stator MMFs. The torque is the product of the circumferential force developed within the air gap and the radius of the air gap and the nature of the torque, which is to increase with increasing displacement angle, causes the rotor to rotate in synchronism with the stator MMF rotation. In the case of a synchronous machine, the rotor rotates in synchronism with the stator MMF rotation. In the case of an induction machine, the rotor rotates at a speed that deviates from synchronism with the stator MMF rotation by the so-called slip. The speed and direction of rotor rotation are dependent upon the electrical frequency and the direction of phase rotation of the stator MMF and are determined by the electronic commutator and rotary motion control system. The previously described rotation is further affected by the number of magnetic poles inherent in the construction of the machine. This description is worded in accordance with the well-known principle of two-pole construction, which is the simplest circuit for rotating electrical machines, where the stator MMF makes a single physical rotation for each electrical cycle of stator fundamental frequency. However, the present invention is applicable to machines having more than two poles and where the stator MMF makes a single physical rotation for every P/2 electrical cycles of stator fundamental frequency, where P is the number of poles. For example, the stator MMF in a six-pole machine makes one physical rotation for every three electrical cycles of stator fundamental frequency, or in other words, the stator MMF in a six-pole machines rotates at one third of the stator fundamental frequency.

A linear electrical machine of the type considered herein can be conveniently and beneficially visualised as being derived from a rotating machine, wherein the cylindrical rotor and stator structures have each been cut axially and unwrapped to achieve a linear form. In this visualisation it is clear that any rotational aspects of the rotating machine will have a linear equivalent, the only limitation being that the linear machine has discontinuities at the end of the rotor and stator structures. In another visualisation, a rotating electrical machine may have such a large diameter that, for all practical purposes, its radius of air gap curvature is so large as to approximate to a straight line or linear arrangement. By means of these visualisations, it is easy to recognise that the shaft rotational speed of a rotating machine is related to its rotor peripheral speed and that this rotor peripheral speed has a direct equivalence to the translator linear speed used in linear machine terminology.

In a linear electrical machine of the type considered herein, a linearly moving magnetomagnetic force (MMF) is applied to the stator winding by means of an electronic commutator and a suitable linear motion control system. The neutral axis of the stator MMF is perpendicular to the axis of movement and the linear position of the neutral axis of the stator MMF is determined by the location of the periodically and linearly indexing stator current entry and exit points. Another MMF is applied to the translator by any convenient means of excitation that causes this translator MMF to adopt a fixed or slowly slipping linear relationship with respect to translator position. In the case of a synchronous machine, the translator MMF axis adopts a fixed alignment relative to translator position by virtue of having a fixed mechanical geometry. In the case of an induction machine, the translator MMF is generated by a process of induction between the stator and the translator and involves a slip process where the nature of the translator MMF is said to slip with respect to the linear movement of the stator MMF. An air gap is present between the stator and the translator. The stator MMF reacts with the translator MMF such that a force is generated within the air gap between the translator and the stator, in the direction of linear movement, whenever there is a linear displacement between the axes of the translator and stator MMFs. The nature of the force is to increase with increasing displacement angle and causes the translator to move in synchronism with the stator MMF movement. In the case of a synchronous machine, the translator moves in synchronism with the stator MMF movement. In the case of an induction machine, the translator moves at a speed that deviates from synchronism with the stator MMF movement by the so-called slip. The speed and direction of translator movement are dependent upon the electrical frequency and the direction of phase rotation of the stator MMF and are determined by the electronic commutator and rotary motion control system. The previously described movement is further affected by the number of magnetic poles inherent in the construction of the machine. This description is worded in accordance with the well-known principle of two-pole construction, which is the simplest circuit for linear electrical machines, where the stator MMF traverses a double pole pitch for each electrical cycle of stator fundamental frequency. However, the present invention is applicable to machines having more than two poles and where the stator MMF traverses a double pole pitch for every P/2 electrical cycles of stator fundamental frequency, where P is the number of poles. For example, the stator MMF in a six-pole machine traverses the full length of the stator every three electrical cycles of stator fundamental frequency.

It will be clear from the above description that the behaviour and control of electrical machines may be characterised in terms of electrical angles and frequencies irrespective of whether they of a rotating or linear type. All references to load angle and rotation of the stator MMF, the moving part MMF and the stator current vector should therefore be taken to apply to both rotating and linear electrical machines.

The electrical machine may further comprise a controller for receiving a phase position signal and supplying a sequence of firing commands to the first and second semiconductor power devices of each switching stage of the electronic commutator circuit in order to cause a stepwise rotation of the stator MMF. An MMF is required in order to produce a magnetic flux in a magnetic circuit, this force being proportional to the magnitude of the current that flows in a winding that surrounds the material in the magnetic circuit. By indexing the points of entry and exit of current in a polygonal stator winding by means of a firing sequence that causes the power semiconductor devices in the switching stages of the electronic commutator to receive gate commands, causing them to turn on and off in sequence, the resultant vector of the stator MMF can be made to rotate in synchronism with the rotation of the stator current vector. The firing commands are used to turn the first and second semiconductor devices on and off at the appropriate times to force the commutation of the current.

The controller may further comprise a phase reference generator for receiving the phase position signal and supplying a phase reference signal in the form of a rotating vector to a firing sequence generator. As mentioned briefly above, the moving part of the electrical machine (rotor or translator) also has an MMF as a result of whatever form of excitation is employed. The rotation of the moving part MMF causes voltages to be induced in the stator. The resulting stator voltage vector rotates in synchronism with the moving part MMF and the angular position of the stator voltage vector is used to generate the phase reference signal. The phase reference signal may therefore be considered to be a rotating reference frame, the direct (D) axis of which is aligned with the stator voltage vector and the quadrature (Q) axis of which is at right-angles with the direct axis. The corresponding stator current vector may then be conveniently expressed as direct and quadrature axis vectorial components relative to the rotating reference frame in order to allow air gap torque and flux to be regulated according to a field orientated control strategy.

In a particularly preferred aspect of the present invention, the controller further comprises a phase reference generator for receiving the phase position signal, and a phase controller for receiving: (i) a phase reference signal from the phase reference generator, (ii) a load angle demand signal and (iii) a signal that represents the stepwise rotation of the stator MMF, and supplying a processed phase reference signal to a firing sequence generator.

The phase position signal can be time-dependent or synchronised to the progression of voltage waveforms between adjacent points of common coupling of the stator winding. In the case of a rotating machine, this progression is linked to rotation of the rotor magnetic circuit. The phase position signal can also be synchronised to the absolute position or the incremental position and direction of the moving part and hence to the stator voltage waveform progression.

The sequence of firing commands can have a fixed phase relationship with the phase reference signal. However, in the particularly preferred aspect of the present invention the phase controller can determine the load angle between the rotating vector representing the phase reference signal and a vector that represents the stator MMF, and then regulate the load angle in response to the load angle demand signal.

The phase controller preferably regulates the load angle by closed loop means such as Proportional Integral and Derivative (PID) control in analogue or digital form.

The phase controller may regulate the load angle to be substantially zero so that the stepwise rotation of the stator MMF (and the gate commutations) occur at points in the stator voltage waveforms where the corresponding incoming and outgoing semiconductor power device waveforms are at or near minimum amplitude in order to reduce power losses and component stresses associated with the commutation process. In other words, the load angle can be regulated to adjust the axis of stator current injection, with respect to the axis of stator voltage, so as to cause the gate commutations to occur at points in the stator voltage waveforms where the corresponding incoming and outgoing semiconductor power device waveforms are at or near minimum amplitude.

The phase controller may regulate the load angle to non-zero angles in order to achieve a desired level of machine excitation, or to achieve a desired relationship between the respective magnitudes of (i) the mean voltage between the first and second dc terminals of the electronic commutator circuit, and (ii) a stator winding voltage, in order to regulate the mean voltage between the first and second dc terminals and/or the mean current flowing in the first and second dc terminals.

In the case where the electrical machine is a synchronous machine having a permanent magnet type rotor providing a machine excitation, the phase controller may determine the load angle between the rotating vector representing the phase reference signal and a vector that represents the stator MMF, and regulate the load angle in response to the load angle demand signal to achieve a desired superimposed component of machine excitation that can be added to or subtracted from the machine excitation provided by the permanent magnet type rotor.

In one embodiment, an electronic commutator circuit for use with a stator winding of a brushless dc electrical machine is provided, wherein the stator winding has a number of coils linked by the same number of points of common coupling, the electronic commutator circuit comprising the same number of switching stages, each switching stage being connected between a respective one of the points of common coupling and first and second dc terminals. The electronic commutator circuit also includes a first reverse blocking semiconductor power device having a first anode, a first cathode, and a first holding current level associated therewith, the first anode being connected to the first dc terminal, the first reverse blocking semiconductor power device being capable of: (i) being turned on entirely by gate control, and (ii) being turned off entirely by gate control when a current substantially greater than the first holding current level is flowing from the first anode to the first cathode; and a second reverse blocking semiconductor power device having a second anode, a second cathode, and a second holding current level associated therewith, the second cathode being connected to the second dc terminal, the second reverse blocking semiconductor power device being capable of: (i) being turned on entirely by gate control, and (ii) being turned off entirely by gate control when a current substantially greater than the second holding current level is flowing from the second anode to the second cathode.

In another embodiment, a brushless dc electrical machine is provided that includes a moving part, a stator, a stator winding having a number of coils linked by the same number of points of common coupling, and an electronic commutator circuit comprising the same number of switching stages, each switching stage being connected between a respective one of the points of common coupling and first and second dc terminals. The electronic commutator circuit includes a first reverse blocking semiconductor power device having a first anode, a first cathode, and a first holding current level associated therewith, the first anode being connected to the first dc terminal, the first reverse blocking semiconductor power device being capable of: (i) being turned on entirely by gate control, and (ii) being turned off entirely by gate control when a current substantially greater than the first holding current level is flowing from the first anode to the first cathode; and a second reverse blocking semiconductor power device having a second anode, a second cathode, and a second holding current level associated therewith, the second cathode being connected to the second dc terminal, the second reverse blocking semiconductor power device being capable of: (i) being turned on entirely by gate control, and (ii) being turned off entirely by gate control when a current substantially greater than the second holding current level is flowing from the second anode to the second cathode.

In still another embodiment, a brushless dc electrical machine is provided that includes: a) a moving part, b) a stator, c) a stator winding having a number of coils linked by the same number of points of common coupling, d) an electronic commutator circuit, and e) a controller. The electronic commutator circuit includes the same number of switching stages, each switching stage being connected between a respective one of the points of common coupling and first and second dc terminals and includes (1) a first reverse blocking semiconductor power device having a first anode, a first cathode, and a first holding current level associated therewith, the first anode being connected to the first dc terminal, the first reverse blocking semiconductor power device being capable of: (i) being turned on entirely by gate control, and (ii) being turned off entirely by gate control when a current substantially greater than the first holding current level is flowing from the first anode to the first cathode; and (2) a second reverse blocking semiconductor power device having a second anode, a second cathode, and a second holding current level associated therewith, the second cathode being connected to the second dc terminal, the second reverse blocking semiconductor power device being capable of: (i) being turned on entirely by gate control, and (ii) being turned off entirely by gate control when a current substantially greater than the second holding current level is flowing from the second anode to the second cathode. The controller receives a phase position signal and supplies a sequence of firing commands to the first and second semiconductor power devices of each switching stage of the electronic commutator circuit in order to cause a stepwise rotation of the stator magnetomotive force (MMF).

In yet another embodiment, an electronic commutator circuit for use with a stator winding of a brushless dc electrical machine is provided wherein the stator winding has a number of coils linked by the same number of points of common coupling, the electronic commutator circuit including the same number of switching stages, each switching stage being connected between a respective one of the points of common coupling and first and second dc terminals. The electronic commutator circuit also includes a first reverse blocking semiconductor power device having a first anode and a first cathode, the first anode being connected to the first dc terminal, wherein during normal operation of the brushless dc electrical machine a first load current will flow from the first anode to the first cathode when the first reverse blocking semiconductor power device is in a latched on state, the first reverse blocking semiconductor power device being capable of: (i) being turned on entirely by gate control, and (ii) being turned off entirely by gate control when the first load current is flowing from the first anode to the first cathode in the latched on state; and a second reverse blocking semiconductor power device having a second anode and a second cathode, the second cathode being connected to the second dc terminal, wherein during normal operation of the brushless dc electrical machine a second load current will flow from the second anode to the second cathode when the second reverse blocking semiconductor power device is in a latched on state, the second reverse blocking semiconductor power device being capable of: (i) being turned on entirely by gate control, and (ii) being turned off entirely by gate control when the second load current is flowing from the second anode to the second cathode in the latched on state.

In still another embodiment, a brushless dc electrical machine is provided that includes a moving part, a stator, a stator winding having a number of coils linked by the same number of points of common coupling, and an electronic commutator circuit that includes the same number of switching stages, each switching stage being connected between a respective one of the points of common coupling and first and second dc terminals. The electronic commutator circuit also includes a first reverse blocking semiconductor power device having a first anode and a first cathode, the first anode being connected to the first dc terminal, wherein during normal operation of the brushless dc electrical machine a first load current will flow from the first anode to the first cathode when the first reverse blocking semiconductor power device is in a latched on state, the first reverse blocking semiconductor power device being capable of: (i) being turned on entirely by gate control, and (ii) being turned off entirely by gate control when the first load current is flowing from the first anode to the first cathode in the latched on state; and a second reverse blocking semiconductor power device having a second anode and a second cathode, the second cathode being connected to the second dc terminal, wherein during normal operation of the brushless dc electrical machine a second load current will flow from the second anode to the second cathode when the second reverse blocking semiconductor power device is in a latched on state, the second reverse blocking semiconductor power device being capable of: (i) being turned on entirely by gate control, and (ii) being turned off entirely by gate control when the second load current is flowing from the second anode to the second cathode in the latched on state.

Yet another embodiment provides a brushless dc electrical machine that includes a) a moving part, b) a stator, c) a stator winding having a number of coils linked by the same number of points of common coupling, d) an electronic commutator circuit, and e) a controller. The electronic commutator circuit includes the same number of switching stages, each switching stage being connected between a respective one of the points of common coupling and first and second dc terminals and further includes: (1) a first reverse blocking semiconductor power device having a first anode and a first cathode, the first anode being connected to the first dc terminal, wherein during normal operation of the brushless dc electrical machine a first load current will flow from the first anode to the first cathode when the first reverse blocking semiconductor power device is in a latched on state, the first reverse blocking semiconductor power device being capable of: (i) being turned on entirely by gate control, and (ii) being turned off entirely by gate control when the first load current is flowing from the first anode to the first cathode in the latched on state; and (2) a second reverse blocking semiconductor power device having a second anode and a second cathode, the second cathode being connected to the second dc terminal, wherein during normal operation of the brushless dc electrical machine a second load current will flow from the second anode to the second cathode when the second reverse blocking semiconductor power device is in a latched on state, the second reverse blocking semiconductor power device being capable of: (i) being turned on entirely by gate control, and (ii) being turned off entirely by gate control when the second load current is flowing from the second anode to the second cathode in the latched on state. The controller receives a phase position signal and supplies a sequence of firing commands to the first and second semiconductor power devices of each switching stage of the electronic commutator circuit in order to cause a stepwise rotation of the stator magnetomotive force (MMF).

Still another embodiment provides a method of commutating a brushless dc electrical machine, wherein the brushless dc electrical machine including a moving part, a stator, a stator winding having a number of coils linked by the same number of points of common coupling, and an electronic commutator circuit comprising the same number of switching stages, each switching stage being connected between a respective one of the points of common coupling and first and second dc terminals, each switching stage of the electronic commutator circuit including a first reverse blocking semiconductor power device having its anode connected to the first dc terminal and a second reverse blocking semiconductor power device having its cathode connected to the second dc terminal. The method includes, in a state where a load current is flowing into the stator winding through the first reverse blocking semiconductor power device of a first switching stage and out of the stator winding through the second reverse blocking semiconductor power device of a second switching stage: (i) turning on the first reverse blocking semiconductor power device of a third switching stage adjacent the first switching stage in an indexing direction entirely by gate control and turning on the second reverse blocking semiconductor power device of a fourth switching stage adjacent the second switching stage in an indexing direction entirely by gate control; and (ii) turning off the first reverse blocking semiconductor power device of the first switching stage entirely by gate control and turning off the second reverse blocking semiconductor power device of the second switching stage entirely by gate control.

Another embodiment provides a brushless dc electrical machine that includes a) a moving part, b) a stator, c) a stator winding having a number of coils linked by the same number of points of common coupling; d) an electronic commutator circuit comprising the same number of switching stages, each switching stage being connected between a respective one of the points of common coupling and first and second dc terminals and including: (1) a first reverse blocking semiconductor power device having a first anode, a first cathode and a first gate, the first anode being connected to the first dc terminal; and (2) a second reverse blocking semiconductor power device having a second anode, a second cathode and a second gate, the second cathode being connected to the second dc terminal; and e) a gating control system structured and configured to: (i) selectively turn on the first reverse blocking semiconductor power devices entirely by gate control by injecting current into the first gates, (ii) selectively turn on the second reverse blocking semiconductor devices entirely by gate control by injecting current into the second gates, (iii) selectively turn off the first reverse blocking semiconductor power devices entirely by gate control by extracting current from the first gates when in a latched on state, and (iv) selectively turn off the second reverse blocking semiconductor power devices entirely by gate control by extracting current from the second gates when in a latched on state.

BRIEF DESCRIPTION OF THE DRAWINGS

Exemplary embodiments of the invention will now be described, with reference to the accompanying drawings, in which.

DETAILED DESCRIPTION OF THE PREFERRED EMBODIMENTS

Figure 1:
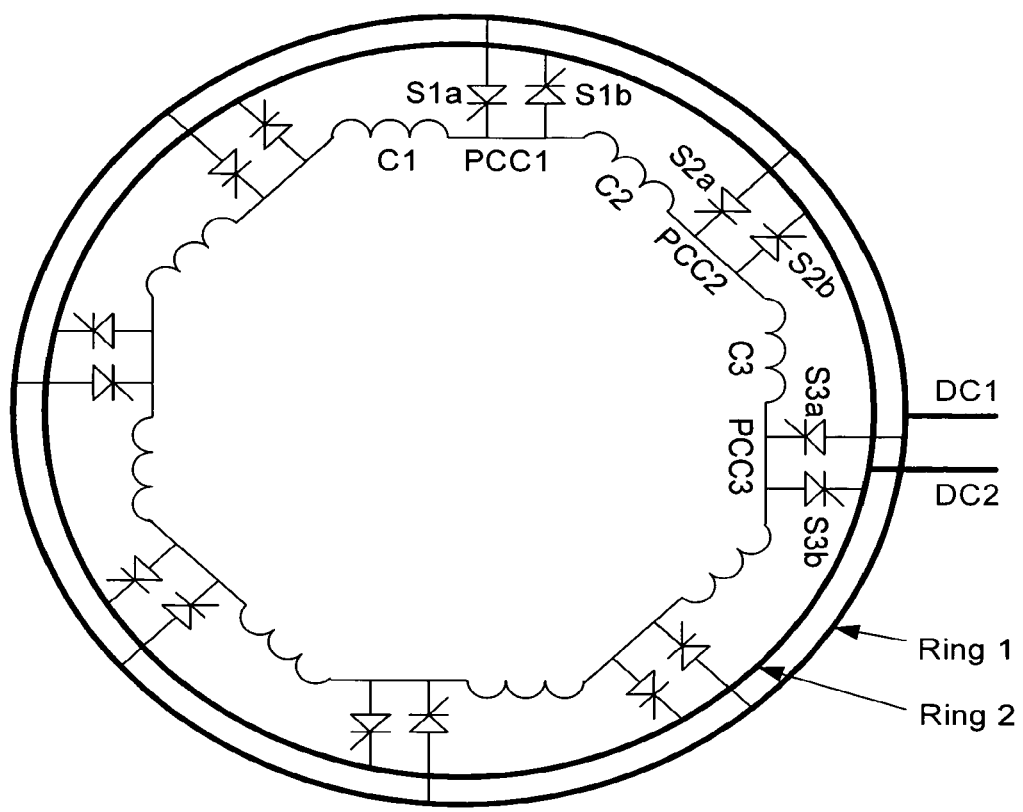
FIG. 1 is a schematic diagram showing a prior art stator winding and associated electronic commutator that replicates a conventional brush and commutator topology for an industry-standard lap wound stator where the brushes are replaced by thyristors and the commutator segments are replaced by a point of common coupling between associated pairs of thyristors.
Figure 2:
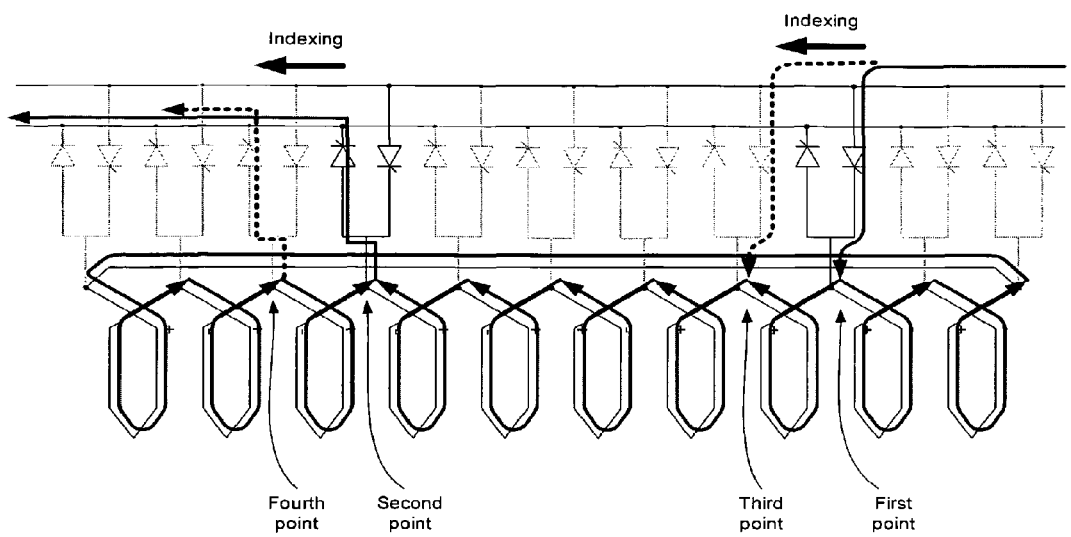
FIG. 2 is a schematic diagram showing a prior art stator winding and electronic commutator circuit in a linear form.
Figure 3:
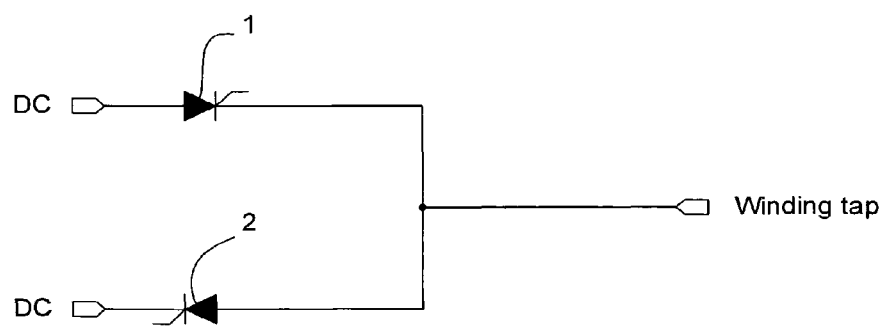
FIG. 3 is a schematic diagram showing a single switching stage of the prior art electronic commutator circuit of FIG. 2.
Figure 4:
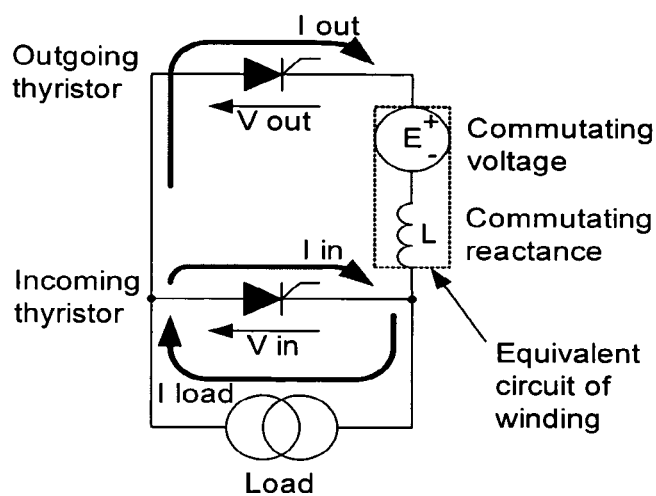
FIG. 4 is a schematic diagram depicting equivalent circuit definitions for a generic commutation process using a pair of thyristors as a switching stage.
Figure 5:
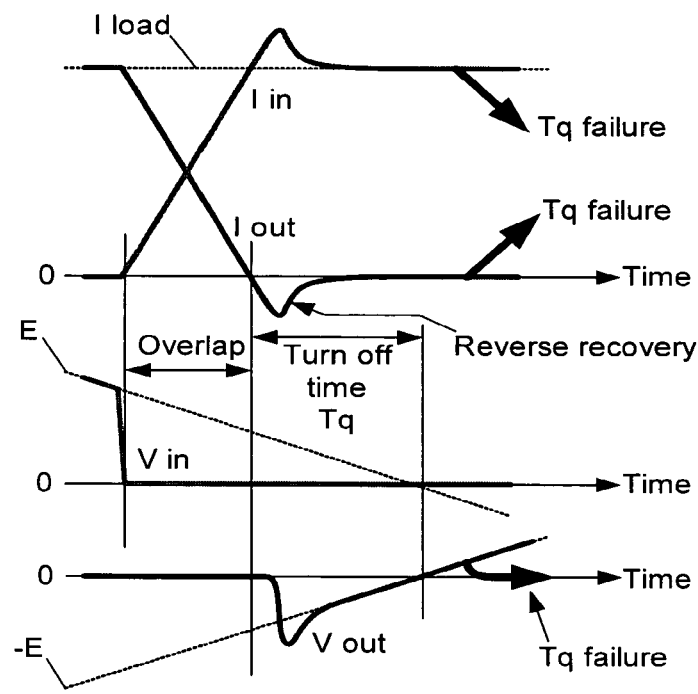
FIG. 5 is waveform diagram showing the idealised commutation waveforms for the generic commutation process of FIG. 4.
Figure 6A:
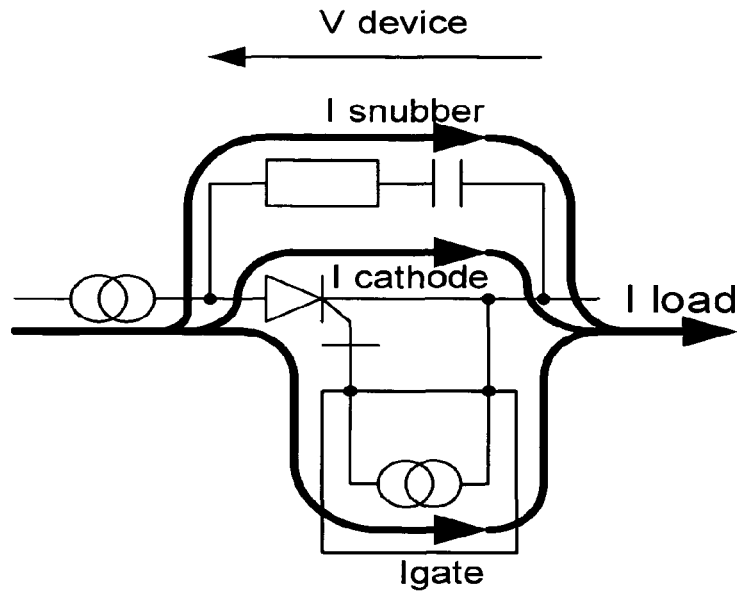
FIG. 6A is a schematic diagram showing a generic commutation process for a Reverse Blocking Gate Turn Off Thyristor (RB-GTO)
Figure 6B:
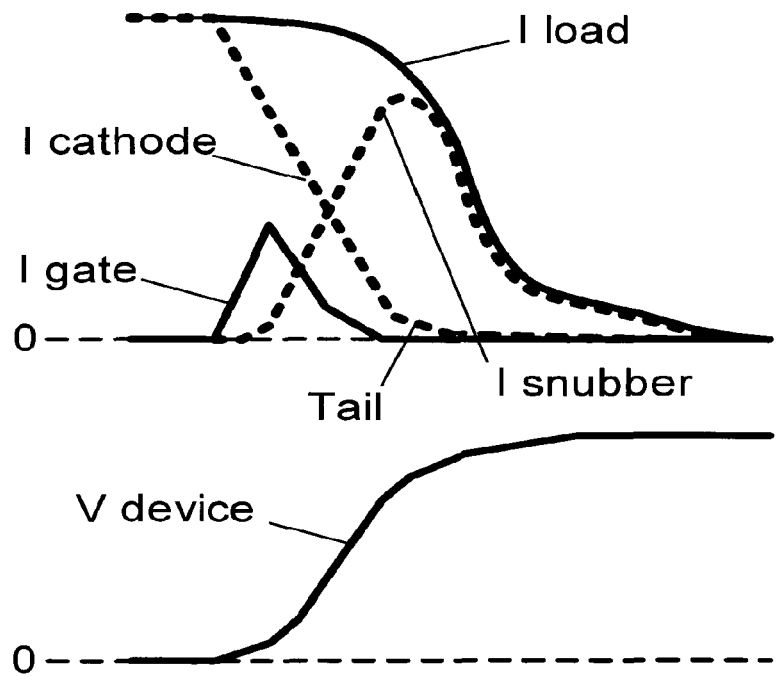
FIG. 6B is a waveform diagram showing the idealised commutation waveforms for the generic commutation process of FIG. 6A.

FIGS. 6A and 6B show a gate commutated forced commutation of a Reverse Blocking Gate Turn Off Thyristor (RB-GTO) in a simplified form. In FIG. 6A, a RB-GTO employs a series connected resistor-capacitor switching aid network (snubber) that is connected in parallel with the power terminals of the RB-GTO. A gating system is employed and this is depicted as a current source "I gate". The load is depicted as a current source "I load". Associated current and voltage waveforms are shown with respect to time in FIG. 6B.

Prior to commutation, load current "I load" flows through the power terminals of the RB-GTO. The current flowing through the RB-GTO, represented by "I cathode" is therefore equal to the load current "I load" while the current source "I gate" and the current flowing through the snubber "I snubber" are both zero. The RB-GTO is considered to be latched in the on state.

To initiate the commutation, the current source "I gate" is injected with the appropriate polarity so as to cause "I cathode" to reduce. The effect of the reduction in the current flowing through the RB-GTO "I cathode" is to reduce the internal regenerative action within the RB-GTO and eventually the RB-GTO will start to turn off This causes the voltage "V device" across the RB-GTO to increase. The increase in "V device" causes the load current "I load" to divert into the snubber causing a further decrease in "I cathode" and a further reduction in the internal regenerative action within the RB-GTO.

Eventually, the RB-GTO reaches the off state and the load current "I load" is fully diverted into the snubber and the voltage "V device" across the RB-GTO has increased sufficiently to cause the load current "I load" to reduce. Although not shown on FIGS. 6A and 6B, an incoming RB-GTO elsewhere in the power circuit would typically be turned on in order to divert the load current "I load" into another beneficial path. However, it can be seen that the RB-GTO can be commutated entirely by gate control.

Figure 7A:
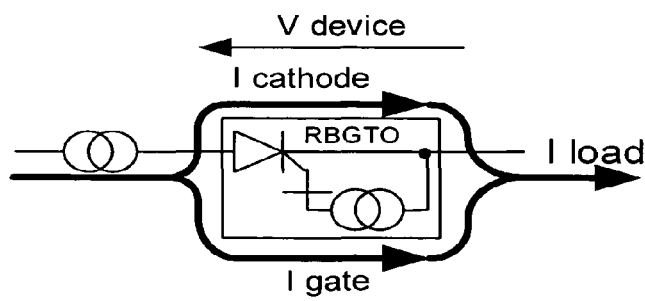
FIG. 7A is a schematic diagram showing a unity gain generic commutation process for a RB-GTO.
Figure 7B:
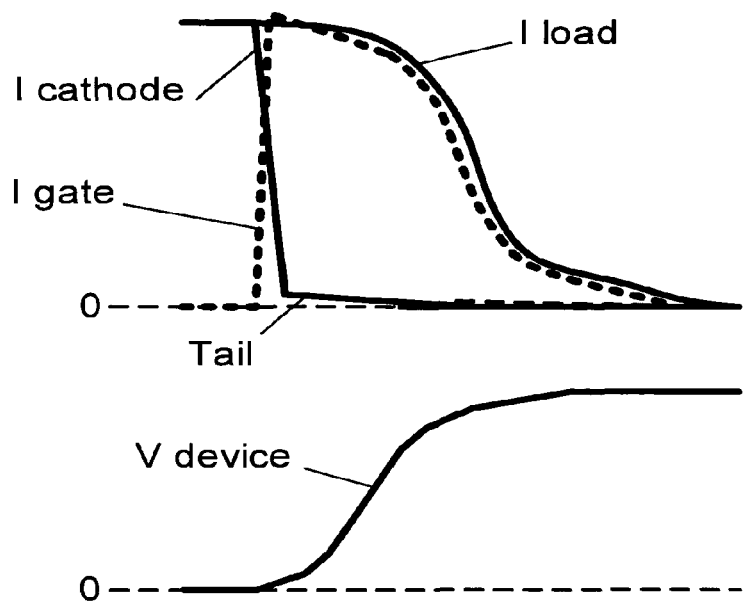
FIG. 7B is a waveform diagram showing the idealised commutation waveforms for the generic commutation process of FIG. 7A.

FIGS. 7A and 7B show a unity gain RB-GTO commutation in a simplified form. The RB-GTO employs a gating system that is physically integrated with the RB-GTO so as to permit gate pulse current amplitude to be far greater than in a discrete RB-GTO and this is represented by a current source "I gate". The load is represented by a current source "I load". Current and voltage waveforms for the unity gain RB-GTO commutation are shown with respect to time in FIG. 7B.

Prior to commutation, load current "I load" flows through the power terminals of the RB-GTO so that the current flowing through the RB-GTO, represented by "I cathode", is equal to "I load" and the current source "I gate" is zero. The RB-GTO is considered to be latched on in this state.

In order to initiate the commutation, the gate current "I gate" is injected with the appropriate polarity so as to cause "I cathode" to reduce. The increase in the gate current "I gate" is at least equal to the reduction in the current flowing through the RB-GTO "I cathode" so the turn off gain is termed as being at least equal to unity. The effect of this reduction in "I cathode" is to reduce the internal regenerative action within the RB-GTO and eventually the RB-GTO starts to turn off This causes the voltage across the RB-GTO "V device" to increase.

Eventually "V device" has increased sufficiently to cause the load current "I load" to start to reduce. Although not shown in FIG. 7A for reasons of clarity, this mode of commutation can be assisted by employing a snubber of the type described above, but the snubber would have to have a much smaller capacity than for a discrete RB-GTO. Also, an incoming RB-GTO elsewhere in the electronic commutator circuit would typically be turned on in order to divert the load current "I load" into another beneficial path. However, once again it can be seen that the RB-GTO can be commutated entirely by gate control.

It will be readily appreciated that although a RB-GTO can be commutated entirely by gate control, the switching power loss in the RB-GTO, the ratings of any snubber components and the electrical stresses in the electronic commutator circuit are strongly and beneficially influenced by the firing of an incoming RB-GTO. The sequencing of the respective RB-GTO switching events can be said to employ an overlap strategy and the meaning of this term is described below with reference to FIGS. 8A to 8C.

Figure 8A:
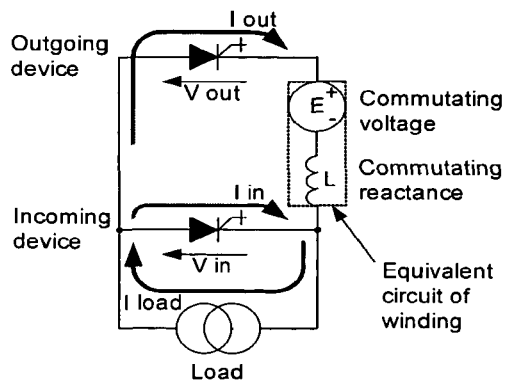
FIG. 8A is a schematic diagram depicting equivalent circuit definitions for a unity gain generic commutation process using a pair of RB-GTOs as a switching stage.
Figure 8B:
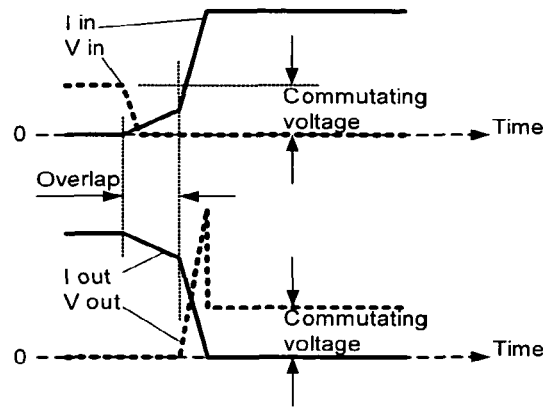
FIG. 8B is waveform diagram showing the idealised commutation waveforms for the generic commutation process of FIG. 8A using an overlap commutation strategy.
Figure 8C:
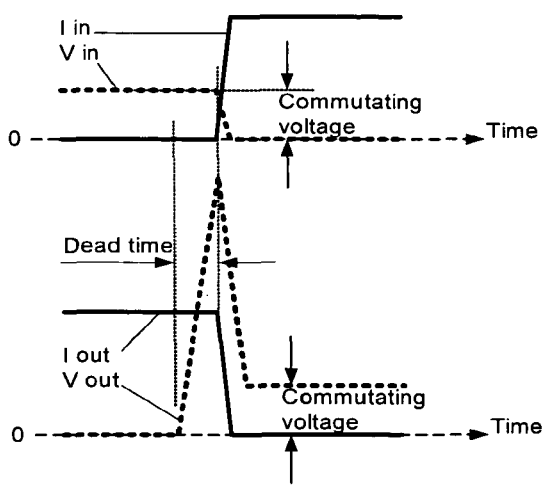
FIG. 8C is a waveform diagram showing the idealised commutation waveforms for the generic commutation process of FIG. 8A using a "dead time" commutation strategy.

FIG. 8A shows a unity gain generic commutation process for the incoming and outgoing RB-GTO of adjacent switching stages. The idealised current and voltage waveforms for the unity gain generic commutation process of FIG. 8A operating under "overlap" and "dead time" (sometimes called "underlap") commutation strategies are shown in FIGS. 8B and 8C, respectively.

With reference to FIG. 8A, a constant current source "I load" represents the current to be commutated out of the outgoing RB-GTO and into the incoming RB-GTO. The rate of change of commutated current is determined by the equivalent circuit representation of the stator winding and comprises a time-variable commuting voltage E and a commutating reactance having an inductance L. The outgoing RB-GTO carries a current "I out" and supports voltage "V out". The incoming RB-GTO carries current "I in" and supports voltage "V in".

Prior to commutation, the load current "I load" is flowing through the outgoing RB-GTO so that "I out" is equal to "I load". The incoming RB-GTO is in the off state so "I in" is zero and "V in" is equal to the commutating voltage E.

In order to initiate the commutation, the incoming RB-GTO is turned on by gate control and the load current "I load" begins to divert from the outgoing RB-GTO into the incoming RB-GTO at a rate E/L. At this point, the commutation deviates from the well-known process of natural commutation because the outgoing RB-GTO is turned off entirely by gate control. This causes "V out" to increase to such an extent that "V out" dominates over the commutating voltage E. Because "V out" is summed with the commutating voltage E, the current in the outgoing RB-GTO is commutated at a rate that is far greater than for the naturally commutated case.

The overlap time shown in FIG. 8B is not shown to scale and in practice it is desirable to minimise the duration of the overlap time because it simply adds to the total duration of the commutation process in cases where the commutating voltage E is much smaller than "V out". Moreover, it is undesirable for the overlap time to be reduced beyond zero (sometimes called a "dead time" or "underlap" strategy) because this adversely affects the component stresses. The "dead time" strategy is shown in FIG. 8C. It should be noted that the positive-going "V out" transient in FIG. 8C has a far greater amplitude and duration that that shown in FIG. 8B, and that the turn off dissipation "E off" in the outgoing RB-GTO is the time integral of the product of "V out" and "I out".

An electronic commutator circuit employing RB-GTOs in accordance with the present invention will be described with reference to FIGS. 9 to 15.

In the interest of clarity, no switching aid networks (snubbers) have been included in FIGS. 9 to 15. However, it will be apparent to the skilled reader that in practice all of the electronic commutator circuits would include snubbers for the purpose of reducing the switching losses in the power electronic devices. The saturable reactors referred to below would also contribute to the overall effectiveness of the switching aid networks as well as providing the benefits described. A particularly desirable form of switching aid network is described in more detail below, with reference to FIGS. 16 and 17.

Although the electronic commutator circuits are described below with reference to a rotating machine, it can be adapted for use with linear machines. In the case of a linear machine, any use of the term "rotor" can be replaced by the term "translator", "moving member" or other suitable term as appropriate. The stator winding of linear machines and their electromagnetic relationship with the moving member will be subject to discontinuities at all stator and moving member ends, whereas the rotating dc electrical machines mentioned below have continuous electromagnetic circuits.

Figure 9:
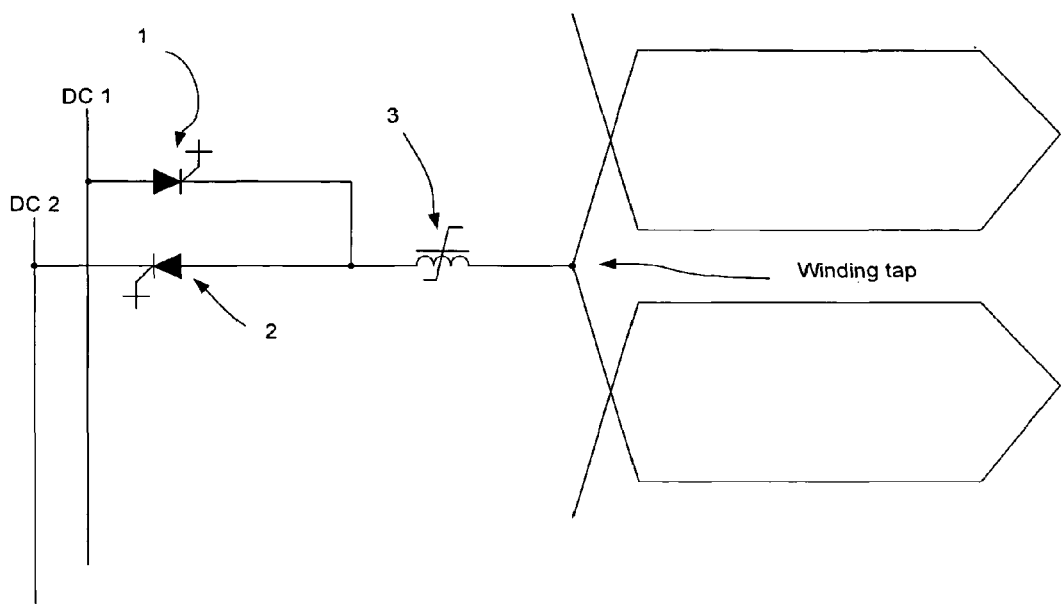
FIG. 9 is a schematic diagram showing a switching stage of an electronic commutator circuit according to the present invention.

FIG. 9 shows a switching stage of a first electronic commutator circuit for a dc electrical machine. The circuit includes a first Reverse Blocking Gate Turn Off Thyristor (RB-GTO) 1 and a second RB-GTO 2. The first and second RB-GTOs 1 and 2 are connected to the left side of a reactor winding of a reactor 3. The right side of the reactor winding is connected to a winding tap n of a stator winding. The first RB-GTO 1 is connected to the reactor winding with the appropriate polarity so that current can flow from the dc terminal DC1 to the winding tap n through the first RB-GTO and the reactor winding. Similarly, the second RB-GTO 2 is connected to the reactor winding 2 with the appropriate polarity so that current can flow from the winding tap n to the dc terminal DC2 through the reactor winding and the second RB-GTO.

The core of the reactor 3 is designed to be saturated at a small fraction of the rated machine winding current. When the reactor winding carries a current that is less than the current needed to saturate the core of the reactor 3 then the inductance of the reactor winding is at a maximum. On the other hand, when the reactor winding carries a current that is greater than the current needed to saturate the core of the reactor 3 then the induction of the reactor winding is at a minimum. When the first
RB-GTO 1 is turned on, the reactor 3 is not saturated because the current carried by the reactor winding is initially low and the reactor winding inductance is beneficial in reducing the turn-on losses in the first RB-GTO. When the first RB-GTO 1 is commutated as a result of the action of a RB-GTO elsewhere in the electronic commutator circuit, the reactor winding inductance is increased while the current carried by the reactor winding is near zero. The reactor winding inductance is therefore beneficial in reducing the turn-off losses in the first RB-GTO 1. The function of the reactor 3 is equally beneficial in reducing the turn-on and turn-off losses of the second RB-GTO 2.

The first and second RB-GTOs 1 and 2 employ integrated gating circuits in order to achieve unity turn-off gain. In other words, the RB-GTOs 1 and 2 need not be reliant upon a switching aid network (snubber) in order to turn off They are capable of turning on and off by means of gate control completely independently of the benefit provided by the coil voltage in the stator winding. This means that the electronic commutator circuit can operate when the coil voltage would not normally be sufficient to promote a conventional thyristor to turn off RB-GTOs are ideal for such electronic commutator circuits because they provide the benefits of gate controlled commutation and a regenerative structure. Such devices provide an excellent compromise between conduction and switching power losses in a very robust compression mounted envelope. RB-GTOs may feature monolithically integrated Gate Turn Off Thyristor (GTO) and reverse blocking structures or they may comprise series-connected discrete GTO and diode wafers, co-located within a common envelope.

When associated with polarised switching aid networks (see below) and saturable reactors, RB-GTOs operating with unit gain turn off experience negligible switching power losses. This improves power density and efficiency even after the effects of switching aid network components have been taken into account.

FIGS. 10 to 15 show commutation from the first RB-GTO $1n$ in one switching stage to the first RB-GTO $1n+1$ in an adjacent switching stage when the electrical machine is operating in the motoring mode. Commutation from the second RB-GTO $2n$ to RB-GTO $2n+1$ will take place approximately 180 degrees at the stator fundamental frequency after the commutation from RB-GTO $1n$ to RB-GTO $1n+1$.

Figure 10:
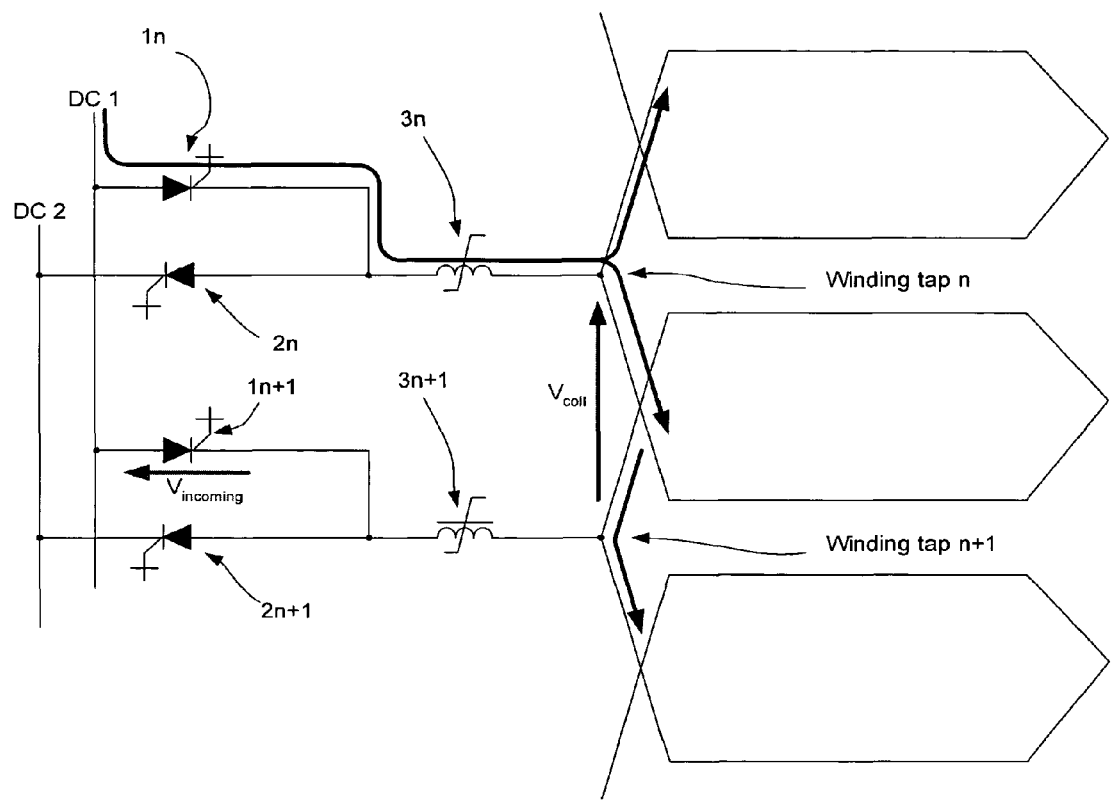
FIGS. 10 to 15 are schematic diagrams showing the operation of the electronic commutator circuit of FIG. 9.

Prior to commutation, load current flows from a first terminal DC1 through the first RB-GTO $1n$ and its associated reactor $3n$ into the stator winding at winding tap n where it divides into two paths of approximately equal magnitude. The two paths of the load current will eventually emerge from the stator winning at a switching stage $2n+m$ where m is the number of winding taps in 180 stator electric degrees and flow through a second RB-GTO $2n+m$ (not shown) to the second terminal DC2. The starting point of the commutation is shown in FIG. 10. The RB-GTO $1n+1$ of the adjacent switching stage is forward biased such that the voltage Vincoming is approximately equal to the coil voltage Vcoil. The reactor $3n$ is saturated.

Figure 11:
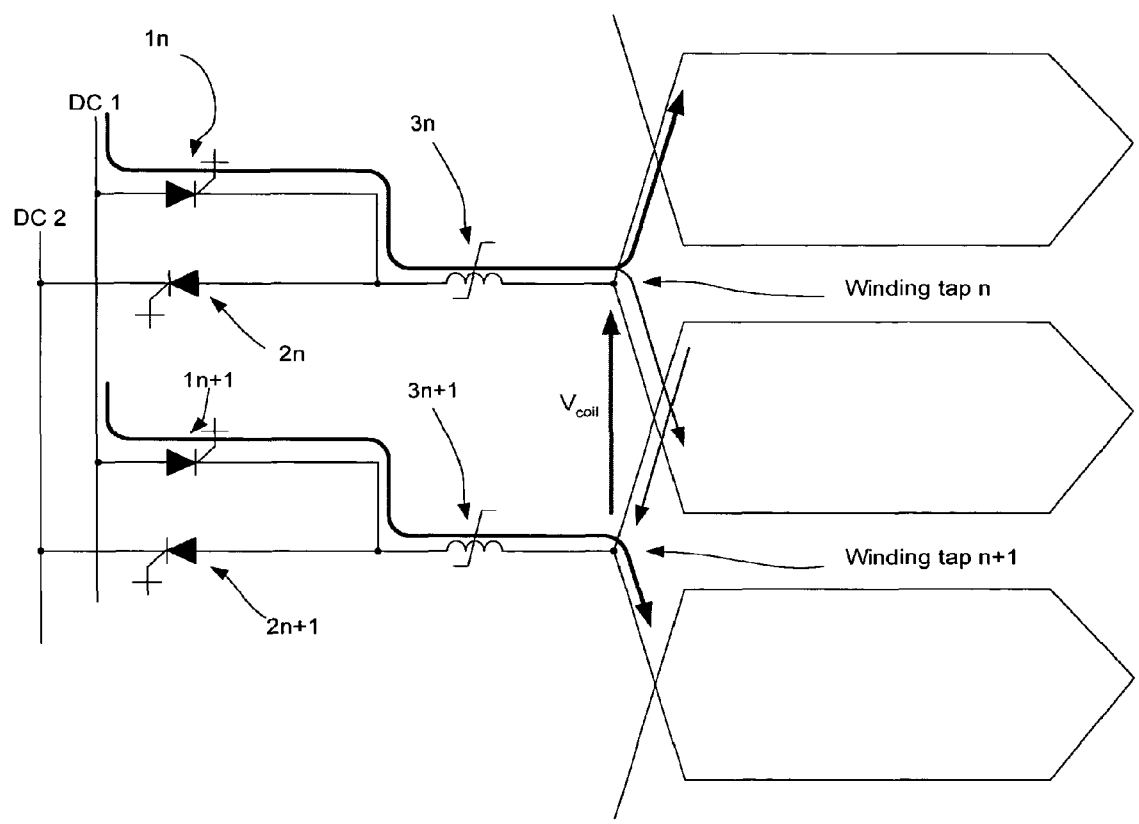
Figure 12:
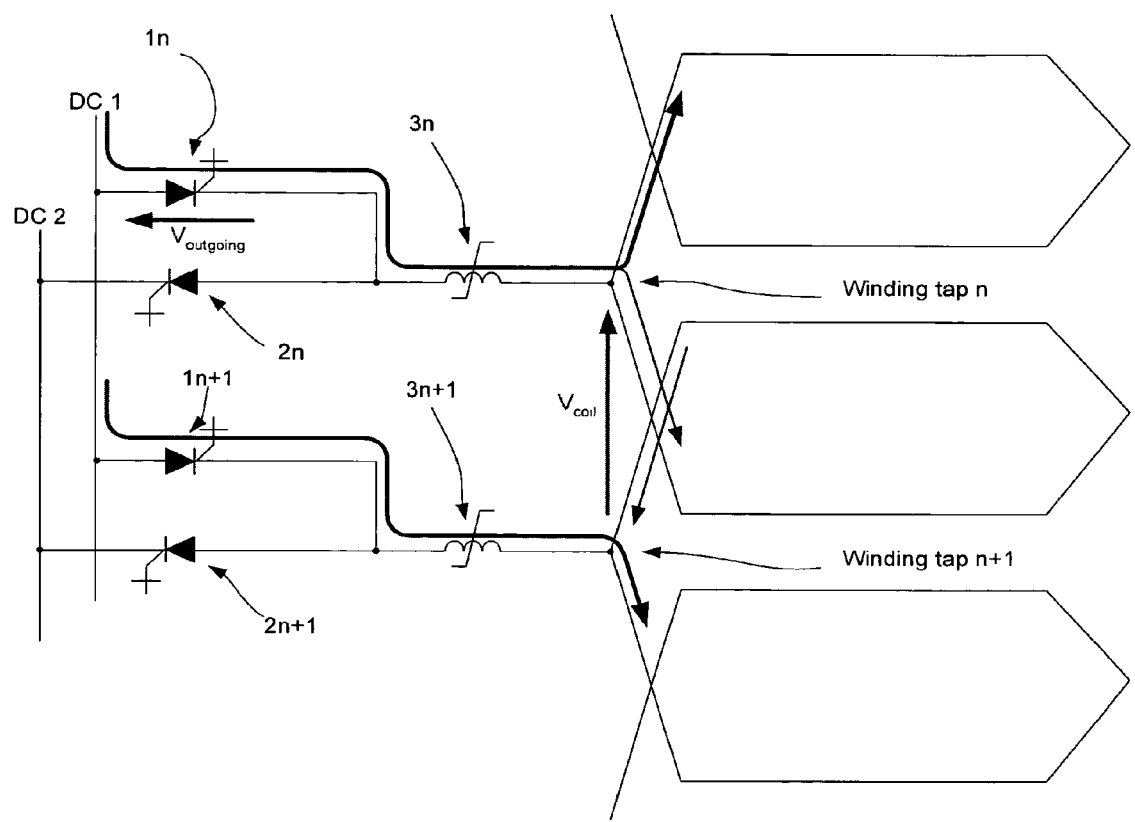

The commutation of current is initiated by turning on the RB-GTO $1n+1$ by gate control so that the load current starts to flow from DC1 through RB-GTO $1n+1$ and the reactor $3n+1$ and into the stator winding at the winding tap n+1 as shown in FIG. 11. Initially, the rate of change of current is limited by the coil voltage Vcoil and the unsaturated inductance of the reactor $3n+1$ in addition to the inductance between the winding tap n and winding tap n+1. Once the current flowing through RB-GTO $1n+1$ has increased to such a level that the reactor $3n+1$ is saturated, the rate of change of current is determined only by the coil voltage and the inductance between the winding tap n and the winding tap n+1. The effect of the initially unsaturated reactor $3n+1$ is to reduce the turn-on power losses in RB-GTO $1n+1$. It will be appreciated that as the current increases in RB-GTO $1n+1$ so the current in RB-GTO $1n$ will reduce at the same rate.

RB-GTO $1n$ is progressively turned off by gate control. This causes its off state voltage Voutgoing (shown in FIG. 12) to increase rapidly. The rate of change of current is now progressively increased as a result of the summation of the rapidly increasing Voutgoing and the relatively static coil voltage Vcoil that is acting on the inductance between the winding tap n and winding tap n+1. In practice, the rate of change of current is dominated by the off state voltage Voutgoing, particularly when the electrical machine is operating at low speeds and the coil voltage is very low.

Figure 13:
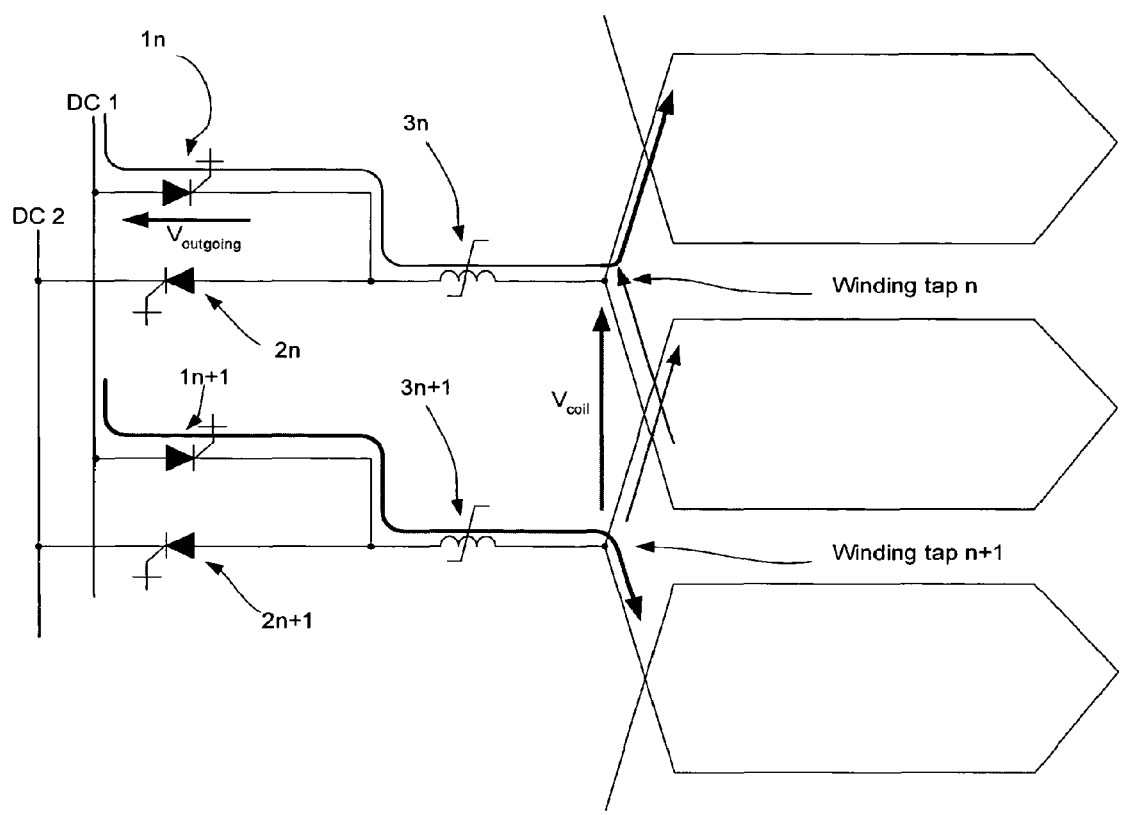

The current flowing through RB-GTO $1n$ continues to reduce at the same rapidly rising rate as the increase in the current flowing through RB-GTO $1n+1$. This eventually results in a reversal of current flow in the coils of the stator winding between the winding tap n and winding tap n+1 as shown in FIG. 13. As the point when the reversed and now increasing current flowing between the winding tap n and winding tap n+1 approaches the value of the current flowing between winding tap n and the preceding winding tap n−1 (not shown), the current flowing in RB-GTO $1n$ and the reactor $3n$ also approaches a current reversal. The inductance of the reactor $3n$ increases to its unsaturated value and this starts to reduce the rate of change of current in the electronic commutator circuit and beneficially reduces the off state voltage Voutgoing of RB-GTO $1n$. The effect of the reactor $3n$ is therefore to reduce the turn-off power losses in RB-GTO $1n$.

Figure 14:
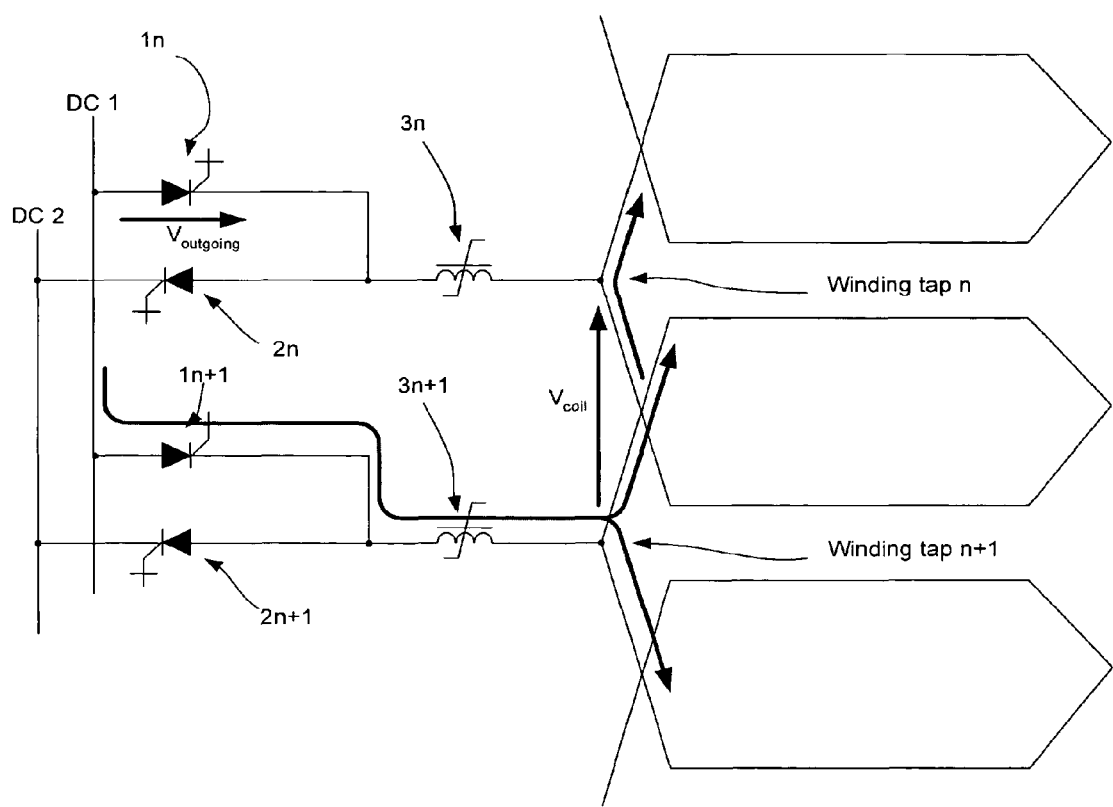

Eventually, the current flowing in RB-GTO $1n$ and the reactor $3n$ reverses. This causes the reverse recovery process to be initiated in RG-GTO $1n$ and eventually forces the off state voltage Voutgoing to reverse. While RB-GTO $1n$ is undergoing the reverse recovery process, the unsaturated inductance of the reactor $1n$ causes the time integral of the reverse recovery current of RG-GTO $1n$ to be limited. This has the beneficial effect of limiting the magnitude of the reversal of the off state voltage Voutgoing and further reduces the turn-off power losses in RB-GTO $1n$. FIG. 14 depicts the situation when RB-GTO $1n$ has completed the reverse recovery process and the reverse recovery current in RB-GTO $1n$ has decayed to zero.

Figure 15:
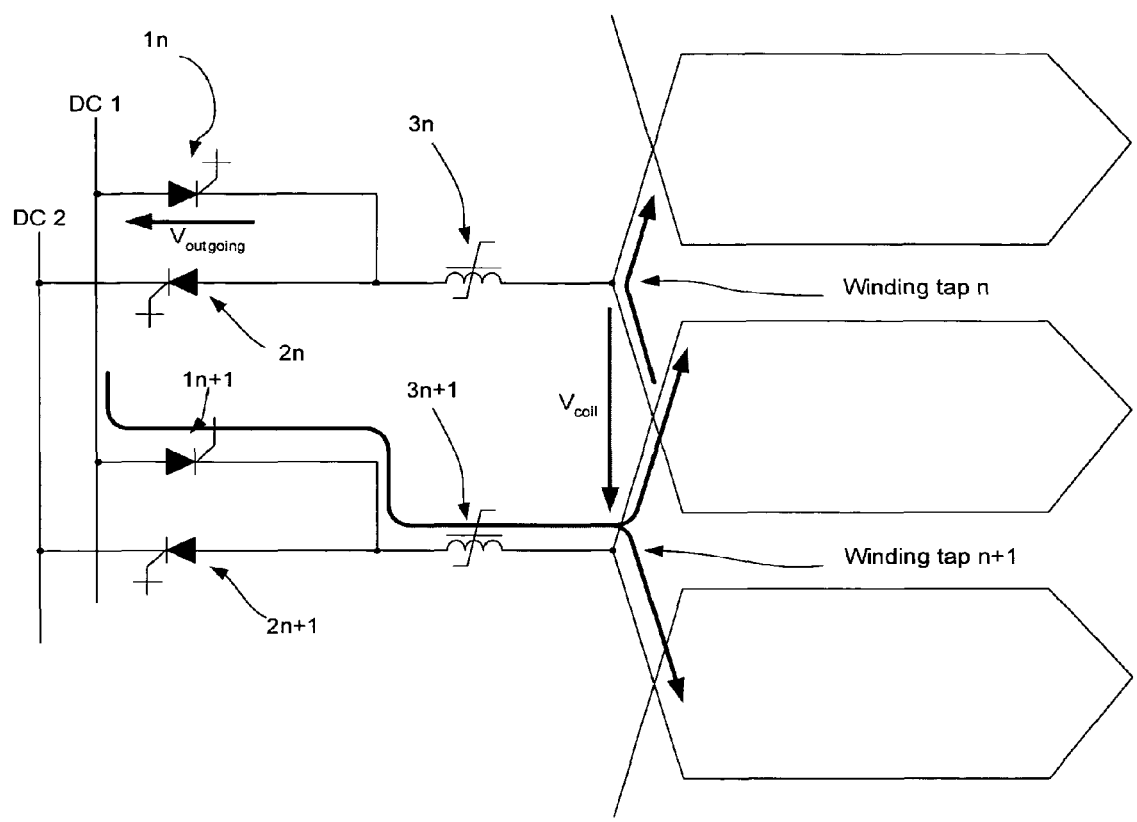

After the reverse recovery process is completed in RB-GTO $1n$, the off state voltage Voutgoing reverses and becomes approximately equal to the coil voltage Vcoil as shown in FIG. 15. After this series of commutation steps, load current flows from the first terminal DC1 through RB-GTO $1n+1$ and the reactor $3n+1$ into the stator winding at winding tap $1n+1$ where it divides into two parts of approximately equal magnitude. The two paths of the load current will eventually emerge from the stator winning at a switching stage $2n+1+m$ where m is the number of winding taps in 180 stator electric degrees and flow through a second RB-GTO $2n+1+m$ (not shown) to the second terminal DC2. The reactor $3n+1$ is saturated.

If the electrical machine is operating in the motoring mode, the preferred method of commutation is to interrupt and quickly re-establish the winding current at the point where the coil voltage is near minimum, the torque per unit dc supply current is near maximum and the RB-GTO (and snubber) switching losses are near minimum so as to closely approach the classical zero voltage, zero current switching ideal. This ideal operating mode is facilitated by the gate turn off capability of the RB-GTOs. In addition to this near ideal operating mode, the RB-GTOs are able to operate according to the above described phase control method.

It will be appreciated that the RB-GTOs may be operated according to both "overlap" and "dead time" commutation strategies, although the choice of commutation principle would have significant impact upon the practical design of the electrical machine, particularly with respect to any snubber design.

As mentioned above, switching aid networks (snubbers) and phase control may have a direct influence on the overall commutation process. A preferred embodiment of the present invention will now be described with reference to FIGS. 16 and 17. The preferred embodiment is optimised by associated control means and includes a particular switching aid network in combination with a saturable reactor and with RB-GTOs operating in the unity gain gate controlled turn off mode.

Figure 16:
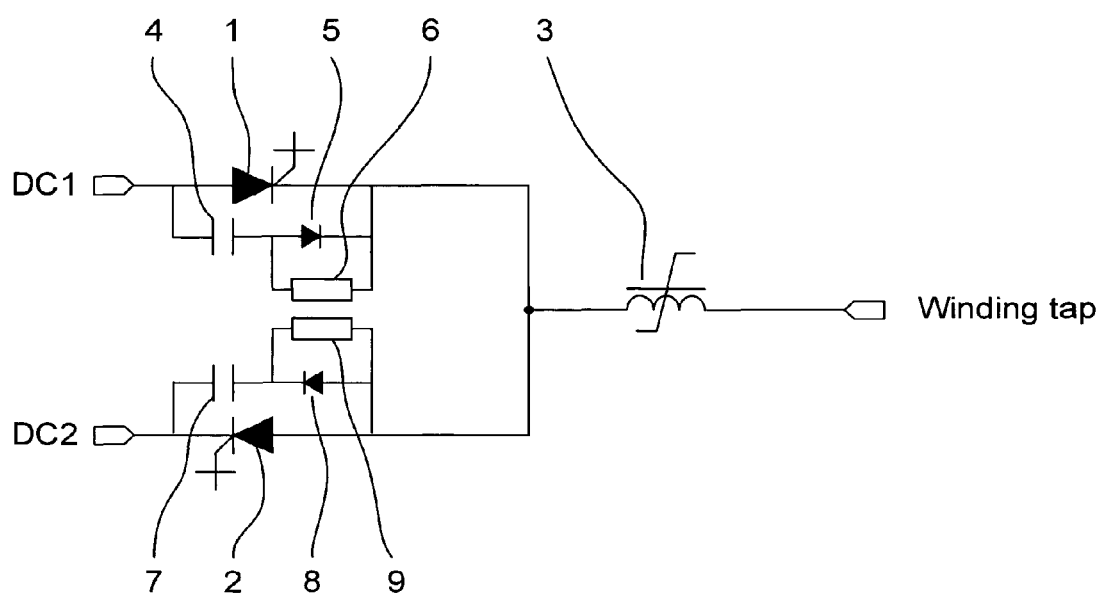
FIG. 16 is a schematic diagram showing a switching stage of the electronic commutator circuit according to the present invention with a switching aid network.

FIG. 16 shows a switching stage including a first RB-GTO 1, a second RB-GTO 2 and a saturable reactor 3 all operating according to the general commutation process described above with reference to FIGS. 10 to 15. FIG. 16 also shows a switching aid network including a first snubber capacitor 4, a first snubber diode 5 and a first snubber resistor 6 associated with the first RB-GTO 1, and a second snubber capacitor 7, a second snubber diode 8 and a second snubber resistor 9 associated with the second RB-GTO 2. The switching aid networks are configured according to the well known industry standard "RCD Polarised Snubber" principle where R is a snubber discharge resistor, C is a snubber capacitor and D is a snubber polarising diode, but they are operated in combination with the reactor 3 and the stator windings in a manner that is specific to the present invention.

Figure 17A:
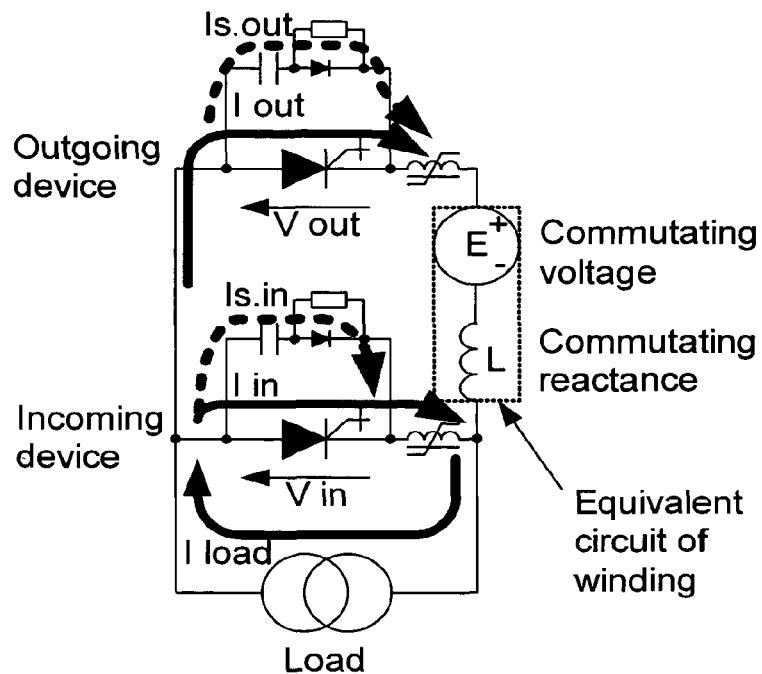
FIG. 17A is a schematic diagram depicting equivalent circuit definitions for a unity gain generic commutation process for the incoming and outgoing RB-GTOs of adjacent switching stages for the case where the RB-GTOs benefit from saturable reactors and polarised switching aid networks.
Figure 17B:
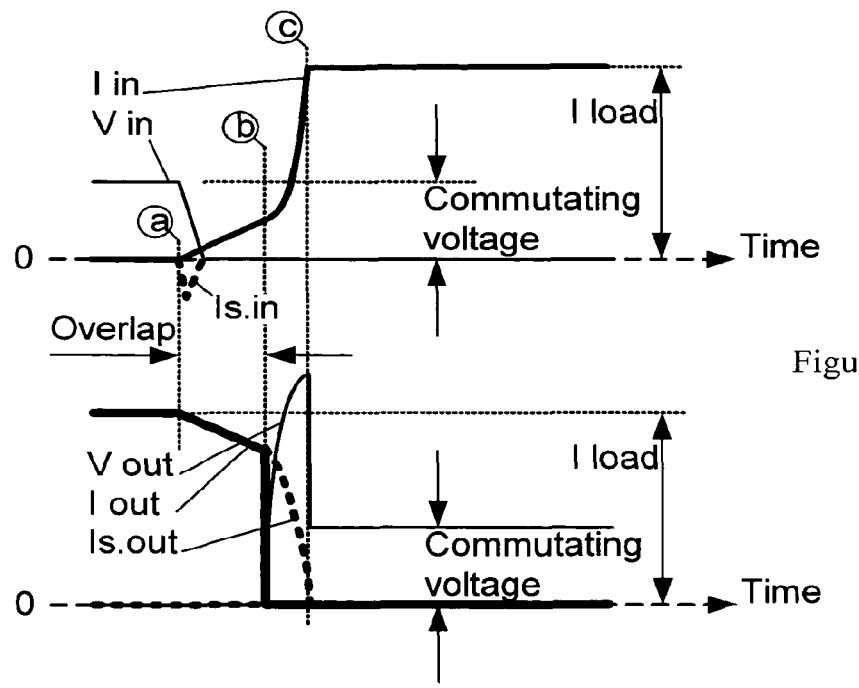
FIG. 17B is waveform diagram showing the idealised commutation waveforms for the generic commutation process of FIG. 17A using an overlap commutation strategy.

FIGS. 17A and 17B illustrate the preferred means of operation of the polarised switching aid networks. FIG. 17A shows the equivalent circuit definitions for a generic unit gain commutation process for the incoming and outgoing RB-GTOs of adjacent switching stages for the case where the RB-GTOs benefit from saturable reactors and polarised switching aid networks. FIG. 17B shows the idealised commutation waveforms for the generic commutation process of FIG. 17A using an overlap commutation strategy. The waveforms correspond closely to those shown in FIG. 8B with two significant exceptions. Firstly, at the start of the overlap period, the current in the incoming snubber "Is.in" experiences a short transient. This current flows in the loop defined by the incoming snubber discharge resistor, the incoming snubber capacitor and the incoming RB-GTO. Secondly, at the end of the overlap period, the current in the outgoing RB-GTO "I out" falls almost immediately to zero while the current in the outgoing snubber "Is.out" increases almost immediately to the value of the current that was flowing in the outgoing RB-GTO at the end of the overlap period. The current in the outgoing RB-GTO is therefore said to have commutated into the switching aid network. Once this has occurred, the current in the outgoing snubber "Is.out" will resonantly decay to zero because the outgoing snubber polarising diode has little forward voltage drop. The voltages across the snubber capacitor and the outgoing RB-GTO "V out" will also resonantly increase to a peak and are approximately equal. The switching aid network is therefore said to be resonant.

It is important to the performance of the electronic commutator circuit that the resonant behaviour of the switching aid network and the control of the commutation process are optimised. In the following description, an outgoing switching stage n commutates to an adjacent incoming switching stage n+1 and the relevant suffix will be applied to all components. The switching stage component suffixes such as n and n+1, for example, are as depicted in FIGS. 10 to 15.

The switching aid network is resonant because the load current "I load" is commutated from the outgoing RB-GTO $1n$ to the incoming RB-GTO $1n+1$ through the series resonant circuit comprising the outgoing snubber capacitor $4n$, the outgoing reactor $3n$, the commutating reactance L and the incoming reactor $3n+1$ (where all semiconductor power devices are considered to be in their "ideal", "on" or "off states"; for example, the incoming RB-GTO $1n+1$ is a short circuit, the outgoing RB-GTO $1n$ is an open circuit and the outgoing snubber polarising diode $5n$ is a short circuit). As such, this is an example of a series inductive-capacitive resonant circuit with current-dependant inductance. In this case, the inductance in the resonant circuit is the summation of three series-connected inductive components, one of which, the commutating reactance L, may be assumed to be relatively constant during any particular commutation and two of which, the outgoing and incoming reactors $3n$ and $3n+1$, are non-linear devices whose inductances depend upon the instantaneous values of current that flow in a particular reactor at any particular point in time. These instantaneous currents are subject to the superposition of:

(i) the resonant ac component of current flowing in the series inductive-capacitive resonant circuit comprising the outgoing snubber capacitor $4n$, the outgoing reactor $3n$, the commutating reactance L and the incoming reactor $3n+1$; and (ii) the respective components of load current flowing from a dc terminal through incoming and outgoing RB-GTOs and reactors to winding taps of the stator winding.

The respective components of load current that flow in the outgoing and incoming reactors $3n$ and $3n+1$ can be considered to be dc bias currents. These are shown in FIG. 17B where three points in time have been labelled (a), (b) and (c).

Between points (a) and (b) the gradients of the currents "I in" and "I out" carried by the incoming and outgoing RB-GTOs are equal and opposite and there is an initial offset of −"I load" between "I in" and "I out". The current in the incoming snubber "Is.in" is constrained to flow in the loop comprising the incoming snubber capacitor $4n+1$, the incoming snubber discharge resistor $6n+1$ and the incoming RB-GTO $1n+1$, and does not flow in the incoming reactor $3n+1$. The current in the outgoing snubber "Is.out" is zero.

Between points (b) and (c) the gradients of the currents "I in" and "Is.out" are equal and opposite and there is a final offset of +"I load" between "I in" and "Is.out". The current in the incoming snubber "Is.in" is zero.

At point (a) and until the current "I in" carried by the incoming RB-GTO $1n+1$ exceeds the saturation current of the incoming reactor $3n+1$, the inductance of the reactor $3n+1$ is at its unsaturated (maximum) value. At all subsequent times shown in FIG. 17B the inductance of the incoming reactor $3n+1$ is at its saturated (minimum) value.

At point (b) the current in the outgoing RB-GTO $1n$ is zero having been rapidly commutated into the outgoing snubber capacitor $4n$. Since the current in the outgoing reactor $3n$ is the sum of "I out" and "Is.out", and the summated current is relatively unaffected by the commutation process involving the outgoing RB-GTO $1n$ and its snubber, around point (b) the inductance of the outgoing reactor $3n$ is at its saturated (minimum) value.

At point (c) the current in the outgoing reactor $3n$ is equal to the current "Is.out" in the outgoing snubber capacitor $4n$ and this has decayed to zero. At and adjacent to point (c), while "Is.out" is less than the saturation current of the outgoing reactor $3n$, the inductance of the outgoing reactor $3n$ is at its unsaturated (maximum) value. At all other times shown in FIG. 17B the inductance of the outgoing reactor $3n$ is at its saturated (minimum) value.

The momentary effect of saturable reactors on the rate of change of current has not been shown in the waveforms of FIG. 17B for reasons of clarity, but their functions and benefits have been described above. In practice, the gradients of the currents "I in" and "I out" carried by the outgoing and incoming RB-GTOs $1n$ and $1n+1$ would be momentarily reduced at point (a), while the gradients of the currents "I in" and "Is.out" would be momentarily reduced at point (c).

Except for the momentary effect of the outgoing reactor $3n$ about point (c), the currents "I in" and "Is.out" follow conventional corresponding quarter sinusoidal resonant responses between points (b) and (c). Similarly, since the forward voltage drop of the outgoing snubber polarising diode $5n$ is negligible, "V out" approximately follows a conventional corresponding quarter sinusoidal response, the peak of which is dependent upon commutating voltage E. An important aspect of the present invention is that the commutation process is not dependent on the presence of a commutating voltage E. However, because the commutating voltage E has an effect on the peak value of "V out" it will influence the ratings of the components employed in the electronic commutator circuit. It is preferred that each individual commutation process is sequenced to occur when the commutating voltage E is zero. This minimises the switching power loss in the outgoing RB-GTO $1n$ and its associated switching aid network. It is also preferred that the overlap duration between points (a) and (b) is minimised so that the duration of the simultaneous conduction of the incoming and outgoing RB-GTOs $1n$ and $1n+1$ is also reduced. This minimises the total conduction power losses in the power semiconductor devices. It is therefore desirable to precisely synchronise each commutation process with respect to the cyclic EMF that is experienced between adjacent winding taps of the stator winding. Moreover, it is possible to precisely synchronise each commutation process with respect to the corresponding rotor position in order to achieve the same effect.

Figure 18:
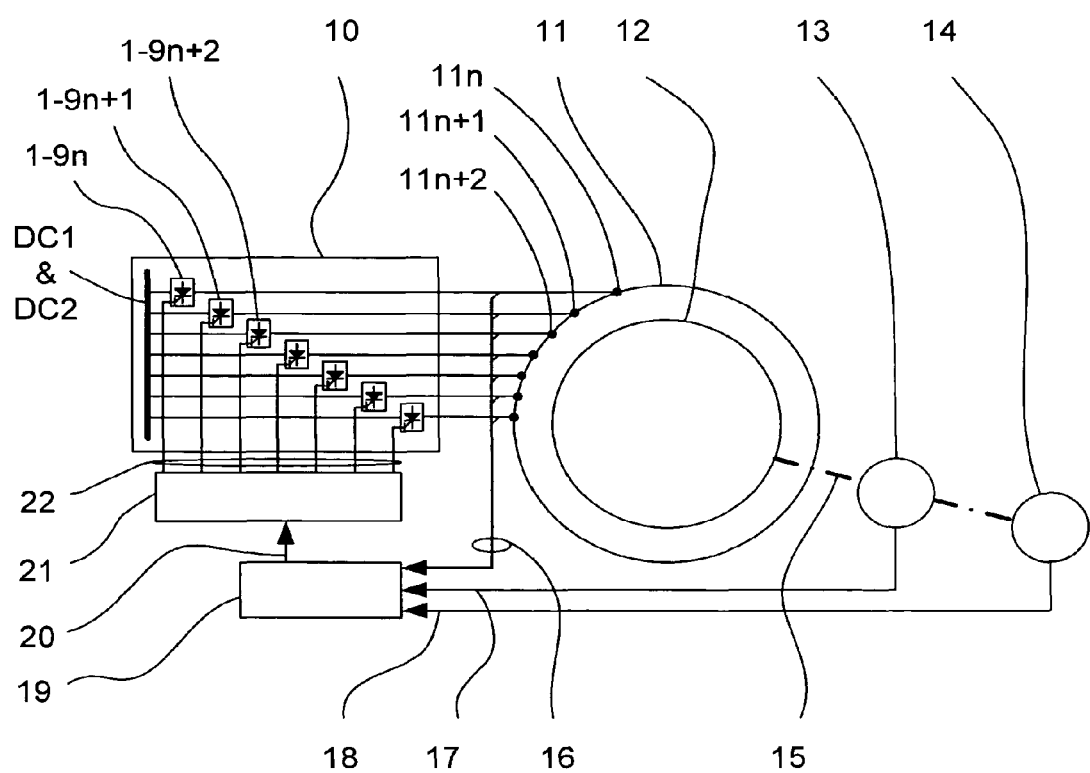
FIG. 18 is a schematic diagram of a first control system for the electronic commutator circuit of FIG. 9.

A suitable control system is shown in FIG. 18. A rotating electrical machine includes a stator winding 11 and a rotor 12. An electronic commutator circuit 10 is connected to stator winding taps $11n$, $11n+$, $11n+2$ and so on of the stator winding 11. The electronic commutator circuit 10 incorporates first and second dc terminals DC1 and DC2 and a number of identical switching stages as shown in FIG. 16. For convenience, these switching stages are labelled $1-9n$, $1-9n+1$, $1-9n+2$ and so on. First and second rotary position encoders 13 and 14 are synchronised to the rotor position by a shaft system 15. The first encoder 13 may be of a type that transmits absolute position information (represented by arrow 17) serially to a phase reference generator 19. The second encoder 14 may be of a type that transmits incremental position and direction information (represented by arrow 18) to the phase reference generator 19. It will be readily appreciated that the first and second encoders 13 and 14 may be combined and associated digital data may take many forms such as the industry standard "bi-phase plus marker" format, for example. Any practical number of the winding tap voltages (for example, $11n$ and $11n+1$) may be sensed by any suitable transducer or by direct connection and this information is transmitted to the phase reference generator 19 along stator voltage lines 16. The phase reference generator 19 can identify the rotor position and/or the stator EMF magnitude and position (typically using industry standard encoder interfaces or zero crossing detectors or digital sampling means, respectively) and phase reference data (represented by arrow 20) is transmitted to a firing sequence generator 21. Incremental position encoders and EMF sensors cannot identify phase reference data until rotation and excitation of the rotor 12 has been established and in this case an open loop sequence of switching stage firing commands must be generated by the firing sequence generator 21. Once rotation and excitation of the rotor 12 has been established, or if an absolute position encoder 13 is employed, then the firing sequence generator 21 generates a closed loop sequence of switching stage firing commands (represented by loop 22) that is synchronised to machine rotation and stator EMF according to an ideal phase relationship.

In the basic motoring case, the switching stage firing commands will be generated to cause indexed commutations in the rotating electrical machine at the ideal points in time where the commutating voltage E shown in FIGS. 17A and 17B is approximately zero. External control means (not shown) are employed to control the dc current source that feeds the dc terminals DC1 and DC2. In the case where the rotating electrical machine is required to operate in a generating mode, to be capable of operating in a motoring and generating mode, or to be capable of operating with other specific and adjustable relationships between dc terminal voltage, rotor excitation and shaft rotational speed, the switching stage firing commands 22 may be phase shifted with respect to the phase reference data 20 in order to produce the desired result. In this case, phase shift data can be supplied to the firing sequence generator 21 by an external means (not shown).

Figure 19:
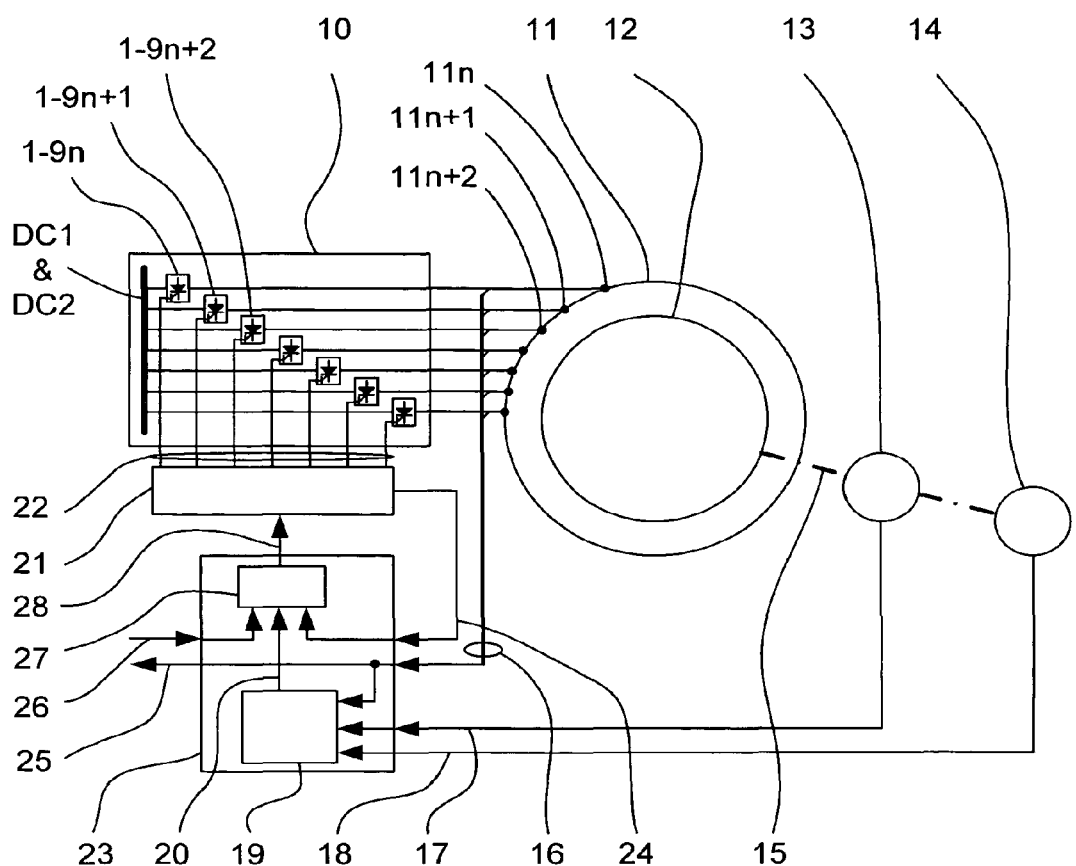
FIG. 19 is a schematic diagram of a second control system for the electronic commutator circuit of FIG. 9.
Figure 20:
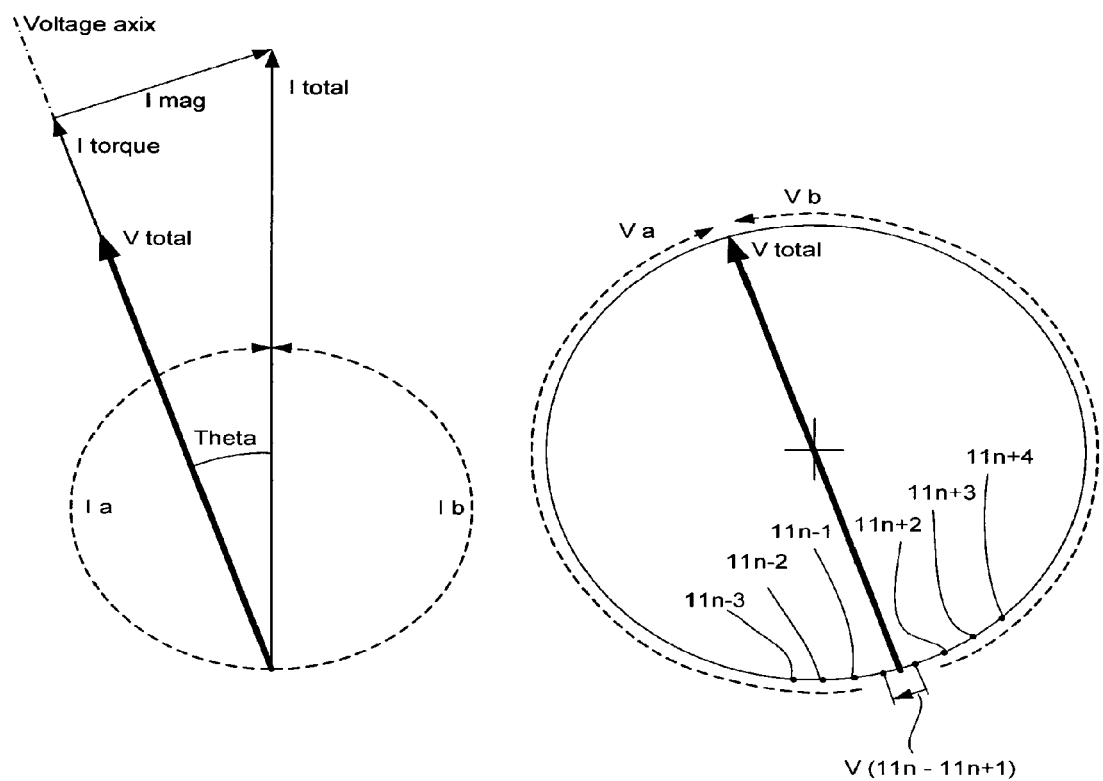
FIG. 20 is a vector diagram showing the motor current and voltage vectors employed in the second control system of FIG. 19.

An electronic commutator circuit may be used to regulate the stator MMF (i.e. the magnetomotive force) of an induction motor or generator. In this case the control system shown in FIG. 18 can be used but it must be supported by additional regulator means including excitation and torque regulation controls that accommodate stator-rotor slip frequency and in the process provide phase reference data for the firing sequence generator 21. A suitable control system is shown in FIG. 19 and provides for field orientated induction machine control. Component parts that are common to the control system shown in FIG. 18 have been given the same reference numeral. The main difference between the two control systems is that the phase reference generator has been incorporated into a field orientated controller 23. The objective of the field orientated controller 23 is to cause the current entry and exit points of the stator winding 11 to index with a beneficial phase position with respect to the voltage on the stator voltage lines 16. Commutator indexing data (represented by arrow 24) is provided by the firing sequence generator 21 and supplied to a phase controller 27 that is also incorporated within the field orientated controller 23. An external controller (not shown) regulates the dc current that is fed into the dc terminals DC1 and DC2. The dc current is divided into two paths within the stator winding 11 and these are depicted as circular vectors "Ia" and "Ib" in FIG. 20. The individual currents have approximately equal magnitude. The phase controller 27 uses the commutator indexing data to determine the angle of the current vector "I total" relative to a phase reference signal 20 which is considered to be the direct axis of a rotating reference frame. The current vector "I total" represents the sum of the circular vectors "Ia" and "Ib" and is also shown in FIG. 20. The voltage on the voltage stator lines 16 and the phase position data 17 and 18 is fed into the phase reference generator 19. The phase reference generator 19 outputs a phase reference signal 20. The phase controller 27 is able to use the phase reference signal 20 to determine the position of a stator winding voltage vector "V total", which is shown in FIG. 20 and described in more detail below. External means (not shown) also provides a load angle demand signal (represented by arrow 26) to the phase controller 27. The phase controller 27 determines the load angle "Theta" between the voltage and current vectors "V total" and "I total" and this can then be regulated by the phase controller in response to the load angle demand signal by generating processed phase reference data (represented by arrow 28) in accordance with well known closed loop control means. Any convenient type of closed loop control means may be used, and an example would be a Proportional Integral and Derivative (PID) control in analogue or digital form.

The stator voltage lines 16 are buffered by the field orientated controller 23 and transmitted (represented by arrow 25) to the external controller (not shown) for regulating the dc current that is fed into the dc terminals DC1 and DC2. The external controller therefore has available data on motor voltage, motor current and the load angle "Theta" so that it can determine the motor flux according to well known machine control means. The external controller regulates the dc current and the load angle demand signal in order to control the motor flux and torque, in both motoring and generating modes.

The motor current and voltage vectors will now be described in more detail with reference to FIG. 20. The vectors are shown with respect to a rotating reference frame, this rotation being at stator fundamental frequency. The stator winding taps 11n, 11n+1 and so on experience voltages with respect to one another. A series of voltage vectors therefore exist, taking the form of a polygon and these are represented as vectors "V a" and "V b" for convenience. The resultant voltage vector of this polygonal series is labelled "V total". In the case of a stator winding with many winding taps, it can be assumed that the axis of the voltage vector "V total" is perpendicular to the individual voltage vectors between the winding taps that experience a voltage null or zero crossing. The example shown in FIG. 20 has the voltage vector "V total" being perpendicular to the individual voltage vector "V (11n–11n n+1)", which is the individual voltage vector between winding tap 11n and winding tap 11n+1. In principle, the angle of the voltage vector "V total" could be continuously determined from the time sequential series of voltage nulls or zero crossings that would be synchronous with the rotating reference frame. However, in a practical stator winding with a limited number of winding taps, the angle between the adjacent winding taps will be sufficiently large to require time interpolation between successive voltage nulls or zero crossings in order to achieve continuous accuracy. With reference to FIG. 19, the voltages sensed on the stator voltage lines 16 may be time interpolated according to well known principles by reference to absolute position information (represented by arrow 17) or incremental position and direction information (represented by arrow 18). In the case of an induction machine, the rotor angular velocity determined from this information will include a rotor slip frequency related term that must be incorporated into the interpolation process. As has been described above, circular representations of the stator winding currents "Ia" and "Ib" have been used for convenience and it will be readily appreciated that the individual current vectors form a similar polygonal series. The resultant current vector "I total" bisects the vectors "Ia" and "Ib" and is considered to be the vector sum of two contributing vector components. The first contributing vector component is "I torque", which is the component of the vector "I total" in alignment with the voltage axis or direct axis of the rotating reference frame. The second contributing vector component is "I mag", which is the component of the vector "I total" in alignment with the quadrature axis of the rotating reference frame. The vector "I torque" is predominantly air gap torque producing current whereas the vector "I mag" is predominantly air gap flux producing current.

The control system described with reference to FIGS. 19 and 20 can be applied to induction generators and synchronous machines operating in motoring and generating modes.

The excitation of a brushless permanent magnet synchronous machine operating in a generating mode and with a dc output voltage can be controlled by summing the excitation provided by the air gap flux producing current "I mag" with the excitation inherent to the permanent magnets. This control will now be described with reference to FIG. 21.

Figure 21:
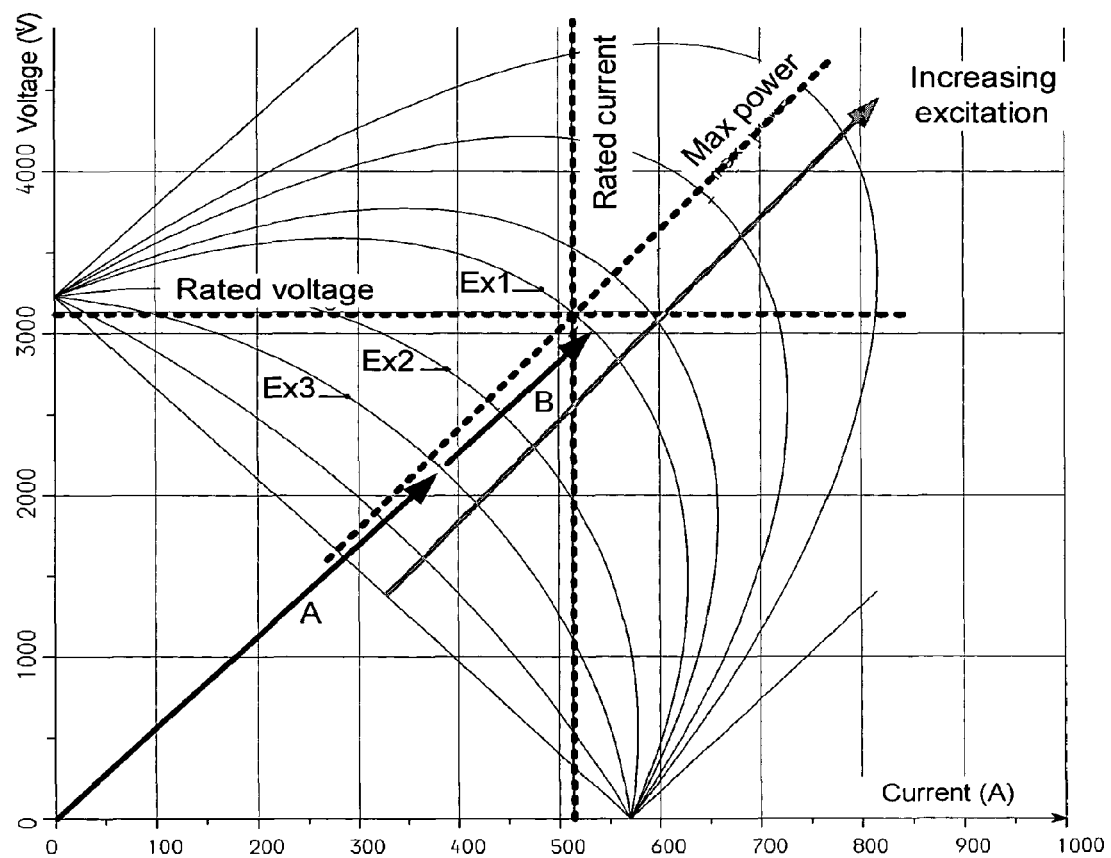
FIG. 21 shows a family of curves describing the output voltage and current characteristics of a conventional three-phase synchronous machine operating in a generating mode with various levels of excitation.

FIG. 21 shows a family of curves describing the output voltage and current characteristics of a conventional three-phase synchronous machine operating in a generating mode with various levels of excitation. FIG. 21 is also applicable to an electronically commutated machine with a synchronous type rotor. Each curve is specific to a constant value of excitation. The output voltage of an electronically commutated machine with a synchronous type rotor operating in a generating mode has a current dependency that is dependant upon excitation. Moreover, that excitation and the load angle are interrelated (an over-excited electronically commutated machine with a synchronous type rotor operates as a generator with a load angle where current lags voltage whereas an under-excited electronically commutated machine with a synchronous type rotor operates as a generator with a load angle where current leads voltage). In conventional synchronous machines with wound rotors the excitation is adjustable by means of a variable (rotor) field current winding to suit the load angle, whereas in an electronically commutated machine with a synchronous type rotor the axis of stator current and (rotor) field current may be adjusted in combination to influence load angle. In an electronically commutated machine with permanent magnet excitation, the rotor component of excitation is provided entirely by the permanent magnets and cannot be adjusted. As shown in FIG. 21, the uppermost curves are the result of increased excitation and the machine is said to be over-excited in this case. The lowest curves are the result of reduced excitation and the machine is said to be under-excited in this case. FIG. 21 also includes example lines of rated voltage, rated current and the locus of maximum power output with variable excitation. An electronically commutated machine according to the present invention could be designed to have a fixed permanent magnet excitation of sufficient magnitude to deliver rated voltage output at rated current output. In this first example, the machine could be excited according to characteristic Ex1 and at load currents less than the rated current the output voltage would be greater than the rated voltage. This is particularly disadvantageous at medium loads where a peak in the output voltage would be experienced. This peak in the output voltage could exceed 115% of rated voltage in some cases and would have a detrimental effect on the size and cost of power conversion equipment. The cost of permanent magnet excitation in curve Ex1 would dominate the total cost of the machine. In a second example, the machine could be excited to a lower extent according to characteristic Ex2 and the ratio of the peak output voltage to output voltage at rated current would increase to 165%. In a third example, the machine could be excited to an even lower extent according to characteristic Ex3. In this case, the ratio of the peak output voltage to output voltage at rated current would increase to over 300% and the output voltage would always "droop" with increasing load current. Such a machine would be completely impractical. The magnitude of the excitation provided by the permanent magnets in Ex3 is represented by the arrow A. By means of this invention, the excitation provided by the air gap flux producing component of stator current "I mag" can be injected in order to cause a beneficial excitation component having a magnitude represented by the arrow B. The total magnitude of the excitation is therefore equal to the sum of the arrows A and B and is equal to the total magnitude of excitation provided by permanent magnets in Ex1. When the current "I mag" is injected then the total current "I total" must increase because "I torque" must be held constant. This increase in the total current "I total" has a consequent impact on the cost of the power conversion equipment.

By regulating the angle "Theta" in FIG. 20 by closed loop means, the cost of an electronically commutated machine with a permanent magnet type rotor may be optimised by trading the total current "I total" and the associated cost of the power conversion equipment against the savings in the permanent magnets. While "Theta" is small, the impact of the current "I mag" on the total current "I total" is also small. This means that small values of "Theta" give a significant beneficial reduction in the cost of the permanent magnets for a small increase in the cost of the power conversion equipment. As "Theta" increases, the increased cost of the power conversion equipment associated with the increase in the total current "I total" becomes significant but it is negated by the benefit of the reduction in light load output voltage (that is the power conversion equipment and machine volt.amp ratings does not increase significantly). If an excessively large value of "Theta" is employed then the cost of the permanent magnets becomes less significant than the cost of the power conversion equipment and machine volt.amp rating. The benefit of optimisation of permanent magnet under excitation against regulated "I mag" compensation are reduced cost and size of the power conversion equipment.

What is claimed is:

1. An electronic commutator circuit for use with a stator winding of a brushless dc electrical machine, the stator winding having a number of coils linked by the same number of points of common coupling, the electronic commutator circuit comprising the same number of switching stages, each switching stage being connected between a respective one of the points of common coupling and first and second dc terminals and including:
   a first reverse blocking semiconductor power device having a first anode, a first cathode, and a first holding current level associated therewith, the first anode being connected to the first dc terminal, the first reverse blocking semiconductor power device being capable of: (i) being turned on entirely by gate control, and (ii) being turned off entirely by gate control when a current substantially greater than the first holding current level is flowing from the first anode to the first cathode; and
   a second reverse blocking semiconductor power device having a second anode, a second cathode, and a second holding current level associated therewith, the second cathode being connected to the second dc terminal, the second reverse blocking semiconductor power device being capable of: (i) being turned on entirely by gate control, and (ii) being turned off entirely by gate control when a current substantially greater than the second holding current level is flowing from the second anode to the second cathode;
   wherein the electronic commutator circuit is structured to cause dc current to flow through the first and second dc terminals and thence through the stator winding responsive to each first reverse blocking semiconductor power device and each second reverse blocking semiconductor power device being turned on entirely by gate control.

2. An electronic commutator circuit according to claim 1, wherein the first and second semiconductor power devices have internal regenerative properties.

3. An electronic commutator circuit according to claim 1, wherein the first and second semiconductor power devices have unity gain turn off properties.

4. An electronic commutator circuit according to claim 1, further comprising a first polarized switching aid network connected in parallel with the first semiconductor power device and a second polarized switching aid network connected in parallel with the second semiconductor power device.

5. An electronic commutator circuit according to claim 1, wherein each switching stage further comprises a reactor having a winding that is connected between:
   (i) the first cathode of the first semiconductor power device and the associated point of common coupling, and
   (ii) the second anode of the second semiconductor power device and the associated point of common coupling.

6. An electronic commutator circuit according to claim 5, wherein the reactor includes a core that saturates at a small fraction of the rated machine winding current of the brushless dc electrical machine.

7. An electronic commutator circuit according to claim 1, wherein the first reverse blocking semiconductor power device is a reverse blocking gate turn off thyristor and the second reverse blocking semiconductor power device is a reverse blocking gate turn off thyristor.

8. A brushless dc electrical machine comprising a moving part, a stator, a stator winding having a number of coils linked by the same number of points of common coupling, and an electronic commutator circuit comprising the same number of switching stages, each switching stage being connected between a respective one of the points of common coupling and first and second dc terminals and including:
   a first reverse blocking semiconductor power device having a first anode, a first cathode, and a first holding current level associated therewith, the first anode being connected to the first dc terminal, the first reverse blocking semiconductor power device being capable of: (i) being turned on entirely by gate control, and (ii) being turned off entirely by gate control when a current substantially greater than the first holding current level is flowing from the first anode to the first cathode; and
   a second reverse blocking semiconductor power device having a second anode, a second cathode, and a second holding current level associated therewith, the second cathode being connected to the second dc terminal, the second reverse blocking semiconductor power device being capable of: (i) being turned on entirely by gate control, and (ii) being turned off entirely by gate control when a current substantially greater than the second holding current level is flowing from the second anode to the second cathode;
   wherein the electronic commutator circuit is structured to cause dc current to flow through the first and second dc terminals and thence through the stator winding responsive to each first reverse blocking semiconductor power device and each second reverse blocking semiconductor power device being turned on entirely by gate control.

9. A brushless dc electrical machine according to claim 8, further comprising a controller for receiving a phase position signal and supplying a sequence of firing commands to the first and second semiconductor power devices of each switching stage of the electronic commutator circuit in order to cause a stepwise rotation of the stator magnetomotive force (MMF).

10. A brushless dc electrical machine according to claim 9, wherein the controller further comprises a phase reference generator for receiving the phase position signal and supplying a phase reference signal in the form of a rotating vector to a firing sequence generator.

11. A brushless dc electrical machine according to claim 10, wherein the sequence of firing commands has a fixed phase relationship with the phase reference signal.

12. A brushless dc electrical machine according to claim 9, wherein the controller further comprises:
   a phase reference generator for receiving the phase position signal, and
   a phase controller for receiving: (i) a phase reference signal from the phase reference generator, (ii) a load angle demand signal and (iii) a signal that represents the stepwise rotation of the stator MMF, and supplying a processed phase reference signal in the form of a rotating vector to a firing sequence generator.

13. A brushless dc electrical machine according to claim 12, wherein the phase controller determines the load angle between the rotating vector representing the processed phase reference signal and a vector that represents the stator MMF, and regulates the load angle in response to the load angle demand signal.

14. A brushless dc electrical machine according to claim 13, wherein the phase controller regulates the load angle by closed loop means.

15. A brushless dc electrical machine according to claim 12, being a synchronous rotating machine with a permanent magnet type rotor providing a machine excitation, wherein the phase controller determines the load angle between the rotating vector representing the phase reference signal and a vector that represents the stator MMF, and regulates the load angle in response to the load angle demand signal to achieve a desired superimposed component of machine excitation that can be added to, or subtracted from, the machine excitation provided by the permanent magnet type rotor.

16. A brushless dc electrical machine according to claim 13, wherein the phase controller regulates the load angle to be substantially zero.

17. A brushless dc electrical machine according to claim 13, wherein the phase controller regulates the load angle in order to achieve a desired level of machine excitation.

18. A brushless dc electrical machine according to claim 13, wherein the phase controller regulates the load angle in order to achieve a desired relationship between the respective magnitudes of:
   (i) the mean voltage between the first and second dc terminals of the electronic commutator circuit, and
   (ii) a stator winding voltage, in order to regulate the mean voltage between the first and second dc terminals and/or the mean current flowing in the first and second dc terminals.

19. An electronic commutator circuit according to claim 18, wherein the first reverse blocking semiconductor power device is a reverse blocking gate turn off thyristor and the second reverse blocking semiconductor power device is a reverse blocking gate turn off thyristor.

20. A brushless dc electrical machine according to claim 9, wherein the phase position signal is time-dependent.

21. A brushless dc electrical machine according to claim 9, wherein the phase position signal is synchronized to the progression of voltage waveforms between adjacent points of common coupling of the stator winding.

22. A brushless dc electrical machine according to claim 9, wherein the phase position signal is synchronized to the absolute position of the moving part.

23. A brushless dc electrical machine according to claim 9, wherein the phase position signal is synchronized to the incremental position and direction of the moving part.

24. A brushless dc electrical machine according to claim 8, being a rotating electrical machine and where the moving part is a rotor.

25. A brushless dc electrical machine according to claim 24, the brushless dc electrical machine being a brushless dc electrical machine with a cage type rotor.

26. A brushless dc electrical machine according to claim 24, the brushless dc electrical machine being a brushless dc electrical machine with a wound type rotor.

27. A brushless dc electrical machine according to claim 24, being a synchronous machine with a wound type rotor.

28. A brushless dc electrical machine according to claim 24, being a synchronous machine with a permanent magnet type rotor.

29. A brushless dc electrical machine according to claim 8, being a linear electrical machine and where the moving part is a translator.

30. A brushless dc electrical machine comprising:
   a) a moving part;
   b) a stator;
   c) a stator winding having a number of coils linked by the same number of points of common coupling;
   d) an electronic commutator circuit comprising the same number of switching stages, each switching stage being connected between a respective one of the points of common coupling and first and second dc terminals and including:
      (1) a first reverse blocking semiconductor power device having a first anode, a first cathode, and a first holding current level associated therewith, the first anode being connected to the first dc terminal, the first reverse blocking semiconductor power device being capable of: (i) being turned on entirely by gate control, and (ii) being turned off entirely by gate control when a current substantially greater than the first holding current level is flowing from the first anode to the first cathode; and
      (2) a second reverse blocking semiconductor power device having a second anode, a second cathode, and a second holding current level associated therewith, the second cathode being connected to the second dc terminal, the second reverse blocking semiconductor power device being capable of: (i) being turned on entirely by gate control, and (ii) being turned off entirely by gate control when a current substantially greater than the second holding current level is flowing from the second anode to the second cathode, wherein the electronic commutator circuit is structured to cause dc current to flow through the first and second dc terminals and thence through the stator winding responsive to each first reverse blocking semiconductor power device and each second reverse blocking semiconductor power device being turned on entirely by gate control; and
   e) a controller for receiving a phase position signal and supplying a sequence of firing commands to the first and second semiconductor power devices of each switching stage of the electronic commutator circuit in order to cause a stepwise rotation of the stator magnetomotive force (MMF).

31. An electronic commutator circuit for use with a stator winding of a brushless dc electrical machine, the stator winding having a number of coils linked by the same number of points of common coupling, the electronic commutator circuit comprising the same number of switching stages, each switching stage being connected between a respective one of the points of common coupling and first and second dc terminals and including:
   a first reverse blocking semiconductor power device having a first anode and a first cathode, the first anode being connected to the first dc terminal, wherein during normal operation of the brushless dc electrical machine a first load current will flow from the first anode to the first cathode when the first reverse blocking semiconductor power device is in a latched on state, the first reverse blocking semiconductor power device being capable of: (i) being turned on entirely by gate control, and (ii) being turned off entirely by gate control when the first load current is flowing from the first anode to the first cathode in the latched on state; and
   a second reverse blocking semiconductor power device having a second anode and a second cathode, the second cathode being connected to the second dc terminal, wherein during normal operation of the brushless dc electrical machine a second load current will flow from the second anode to the second cathode when the second reverse blocking semiconductor power device is in a latched on state, the second reverse blocking semiconductor power device being capable of: (i) being turned on entirely by gate control, and (ii) being turned off entirely by gate control when the second load current is flowing from the second anode to the second cathode in the latched on state;
   wherein the electronic commutator circuit is structured to cause dc current to flow through the first and second dc terminals and thence through the stator winding responsive to each first reverse blocking semiconductor power device and each second reverse blocking semiconductor power device being turned on entirely by gate control.

32. An electronic commutator circuit according to claim 31, wherein the first and second semiconductor power devices have internal regenerative properties.

33. An electronic commutator circuit according to claim 31, wherein the first and second semiconductor power devices have unity gain turn off properties.

34. An electronic commutator circuit according to claim 31, further comprising a first polarized switching aid network connected in parallel with the first semiconductor power device and a second polarized switching aid network connected in parallel with the second semiconductor power device.

35. An electronic commutator circuit according to claim 31, wherein each switching stage further comprises a reactor having a winding that is connected between:
   (i) the first cathode of the first semiconductor power device and the associated point of common coupling, and
   (ii) the second anode of the second semiconductor power device and the associated point of common coupling.

36. An electronic commutator circuit according to claim 35, wherein the reactor includes a core that saturates at a small fraction of the rated machine winding current of the brushless dc electrical machine.

37. A brushless dc electrical machine comprising a moving part, a stator, a stator winding having a number of coils linked by the same number of points of common coupling, and an electronic commutator circuit comprising the same number of switching stages, each switching stage being connected between a respective one of the points of common coupling and first and second dc terminals and including:
   a first reverse blocking semiconductor power device having a first anode and a first cathode, the first anode being connected to the first dc terminal, wherein during normal operation of the brushless dc electrical machine a first load current will flow from the first anode to the first cathode when the first reverse blocking semiconductor power device is in a latched on state, the first reverse blocking semiconductor power device being capable of: (i) being turned on entirely by gate control, and (ii) being turned off entirely by gate control when the first load current is flowing from the first anode to the first cathode in the latched on state; and a second reverse blocking semiconductor power device having a second anode and a second cathode, the second cathode being connected to the second dc terminal, wherein during normal operation of the brushless dc electrical machine a second load current will flow from the second anode to the second cathode when the second reverse blocking semiconductor power device is in a latched on state, the second reverse blocking semiconductor power device being capable of: (i) being turned on entirely by gate control, and (ii) being turned off entirely by gate control when the second load current is flowing from the second anode to the second cathode in the latched on state;

wherein the electronic commutator circuit is structured to cause dc current to flow through the first and second dc terminals and thence through the stator winding responsive to each first reverse blocking semiconductor power device and each second reverse blocking semiconductor power device being turned on entirely by gate control.

38. A brushless dc electrical machine according to claim 37, further comprising a controller for receiving a phase position signal and supplying a sequence of firing commands to the first and second semiconductor power devices of each switching stage of the electronic commutator circuit in order to cause a stepwise rotation of the stator magnetomotive force (MMF).

39. A brushless dc electrical machine according to claim 38, wherein the controller further comprises a phase reference generator for receiving the phase position signal and supplying a phase reference signal in the form of a rotating vector to a firing sequence generator.

40. A brushless dc electrical machine according to claim 39, wherein the sequence of firing commands has a fixed phase relationship with the phase reference signal.

41. A brushless dc electrical machine according to claim 38, wherein the controller further comprises:
a phase reference generator for receiving the phase position signal, and
a phase controller for receiving: (i) a phase reference signal from the phase reference generator, (ii) a load angle demand signal and (iii) a signal that represents the stepwise rotation of the stator MMF, and supplying a processed phase reference signal in the form of a rotating vector to a firing sequence generator.

42. A brushless dc electrical machine according to claim 41, wherein the phase controller determines the load angle between the rotating vector representing the processed phase reference signal and a vector that represents the stator MMF, and regulates the load angle in response to the load angle demand signal.

43. A brushless dc electrical machine according to claim 41, being a synchronous rotating machine with a permanent magnet type rotor providing a machine excitation, wherein the phase controller determines the load angle between the rotating vector representing the phase reference signal and a vector that represents the stator MMF, and regulates the load angle in response to the load angle demand signal to achieve a desired superimposed component of machine excitation that can be added to, or subtracted from, the machine excitation provided by the permanent magnet type rotor.

44. A brushless dc electrical machine according to claim 42, wherein the phase controller regulates the load angle by closed loop means.

45. A brushless dc electrical machine according to claim 42, wherein the phase controller regulates the load angle to be substantially zero.

46. A brushless dc electrical machine according to claim 42, wherein the phase controller regulates the load angle in order to achieve a desired level of machine excitation.

47. A brushless dc electrical machine according to claim 42, wherein the phase controller regulates the load angle in order to achieve a desired relationship between the respective magnitudes of:
(i) the mean voltage between the first and second dc terminals of the electronic commutator circuit, and
(ii) a stator winding voltage, in order to regulate the mean voltage between the first and second dc terminals and/or the mean current flowing in the first and second dc terminals.

48. A brushless dc electrical machine according to claim 38, wherein the phase position signal is time-dependent.

49. A brushless dc electrical machine according to claim 38, wherein the phase position signal is synchronized to the progression of voltage waveforms between adjacent points of common coupling of the stator winding.

50. A brushless dc electrical machine according to claim 38, wherein the phase position signal is synchronized to the absolute position of the moving part.

51. A brushless dc electrical machine according to claim 36, wherein the phase position signal is synchronized to the incremental position and direction of the moving part.

52. A brushless dc electrical machine according to claim 37, being a rotating electrical machine and where the moving part is a rotor.

53. A brushless dc electrical machine according to claim 52, the brushless dc electrical machine being a brushless dc electrical machine with a cage type rotor.

54. A brushless dc electrical machine according to claim 52, the brushless dc electrical machine being a brushless dc electrical machine with a wound type rotor.

55. A brushless dc electrical machine according to claim 52, being a synchronous machine with a wound type rotor.

56. A brushless dc electrical machine according to claim 52, being a synchronous machine with a permanent magnet type rotor.

57. A brushless dc electrical machine according to claim 37, being a linear electrical machine and where the moving part is a translator.

58. A brushless dc electrical machine comprising:
a) a moving part;
b) a stator;
c) a stator winding having a number of coils linked by the same number of points of common coupling;
d) an electronic commutator circuit comprising the same number of switching stages, each switching stage being connected between a respective one of the points of common coupling and first and second dc terminals and including:
(1) a first reverse blocking semiconductor power device having a first anode and a first cathode, the first anode being connected to the first dc terminal, wherein during normal operation of the brushless dc electrical machine a first load current will flow from the first anode to the first cathode when the first reverse blocking semiconductor power device is in a latched on state, the first reverse blocking semiconductor power device being capable of: (i) being turned on entirely by gate control, and (ii) being turned off entirely by gate control when the first load current is flowing from the first anode to the first cathode in the latched on state; and (2) a second reverse blocking semiconductor power device having a second anode and a second cathode, the second cathode being connected to the second dc terminal, wherein during normal operation of the brushless dc electrical machine a second load current will flow from the second anode to the second cathode when the second reverse blocking semiconductor power device is in a latched on state, the second reverse blocking semiconductor power device being capable of: (i) being turned on entirely by gate control, and (ii) being turned off entirely by gate control when the second load current is flowing from the second anode to the second cathode in the latched on state, wherein the electronic commutator circuit is structured to cause dc current to flow through the first and second dc terminals and thence through the stator winding responsive to each first reverse blocking semiconductor power device and each second reverse blocking semiconductor power device being turned on entirely by gate control; and e) a controller for receiving a phase position signal and supplying a sequence of firing commands to the first and second semiconductor power devices of each switching stage of the electronic commutator circuit in order to cause a stepwise rotation of the stator magnetomotive force (MMF).

59. A method of commutating a brushless dc electrical machine, the brushless dc electrical machine including a moving part, a stator, a stator winding having a number of coils linked by the same number of points of common coupling, and an electronic commutator circuit comprising the same number of switching stages, each switching stage being connected between a respective one of the points of common coupling and first and second dc terminals, each one of the switching stages of the electronic commutator circuit including a first reverse blocking semiconductor power device having its anode connected to the first dc terminal and a second reverse blocking semiconductor power device having its cathode connected to the second dc terminal, the method comprising:

in a state where a load current is flowing into the stator winding through the first reverse blocking semiconductor power device of a first one of the switching stages and out of the stator winding through the second reverse blocking semiconductor power device of a second one of the switching stages:

(i) turning on the first reverse blocking semiconductor power device of a third one of the switching stages adjacent the first one of the switching stages in an indexing direction entirely by gate control and turning on the second reverse blocking semiconductor power device of a fourth one of the switching stages adjacent the second one of the switching stages in the indexing direction entirely by gate control; and (ii) turning off the first reverse blocking semiconductor power device of the first one of the switching stages entirely by gate control and turning off the second reverse blocking semiconductor power device of the second one of the switching stages entirely by gate control.

60. A brushless dc electrical machine comprising:
a) a moving part;
b) a stator;
c) a stator winding having a number of coils linked by the same number of points of common coupling;
d) an electronic commutator circuit comprising the same number of switching stages, each switching stage being connected between a respective one of the points of common coupling and first and second dc terminals and including:
  (1) a first reverse blocking semiconductor power device having a first anode, a first cathode and a first gate, the first anode being connected to the first dc terminal; and
  (2) a second reverse blocking semiconductor power device having a second anode, a second cathode and a second gate, the second cathode being connected to the second dc terminal; and
e) a gating control system structured and configured to: (i) selectively turn on the first reverse blocking semiconductor power devices entirely by gate control by injecting current into the first gates, (ii) selectively turn on the second reverse blocking semiconductor devices entirely by gate control by injecting current into the second gates, (iii) selectively turn off the first reverse blocking semiconductor power devices entirely by gate control by extracting current from the first gates when in a latched on state, and (iv) selectively turn off the second reverse blocking semiconductor power devices entirely by gate control by extracting current from the second gates when in a latched on state;
wherein the electronic commutator circuit is structured to cause dc current to flow through the first and second dc terminals and thence through the stator winding responsive to each first reverse blocking semiconductor power device and each second reverse blocking semiconductor power device being turned on entirely by gate control.

* * * * *